(12) United States Patent
Hamada et al.

(10) Patent No.: US 12,310,210 B2
(45) Date of Patent: May 20, 2025

(54) OLED LIGHT-EMITTING DEVICE, DISPLAY DEVICE, ELECTRONIC DEVICE, AND METHOD OF MANUFACTURING OLED LIGHT-EMITTING DEVICE

(71) Applicant: Wuhan Tianma Micro-Electronics Co., Ltd., Wuhan (CN)

(72) Inventors: Keita Hamada, Kanagawa (JP); Shigeru Mori, Kanagawa (JP)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 346 days.

(21) Appl. No.: 17/455,793

(22) Filed: Nov. 19, 2021

(65) Prior Publication Data

US 2022/0165807 A1 May 26, 2022

(30) Foreign Application Priority Data

Nov. 26, 2020 (JP) ................................ 2020-196351
Sep. 28, 2021 (JP) ................................ 2021-157700

(51) Int. Cl.
*H01L 27/32* (2006.01)
*H01L 51/50* (2006.01)
(Continued)

(52) U.S. Cl.
CPC .............. *H10K 59/32* (2023.02); *H10K 50/13* (2023.02); *H10K 50/15* (2023.02); *H10K 50/16* (2023.02);
(Continued)

(58) Field of Classification Search
CPC ......... H10K 59/32; H10K 50/13; H10K 50/19
See application file for complete search history.

(56) References Cited

U.S. PATENT DOCUMENTS 9,978,818 B2 * 5/2018 Xiong .................. H10K 59/122
11,043,649 B2 * 6/2021 Yang ..................... H10K 50/15
(Continued)

FOREIGN PATENT DOCUMENTS

CN 111755610 A * 10/2020 ............. H10K 50/15

OTHER PUBLICATIONS

Machine translation, Maeda, Chinese Pat. Pub. No. CN111755610A, translation date: Feb. 23, 2024, Clarivate Analytics, all pages. (Year: 2024).*

*Primary Examiner* — Victoria K. Hall
(74) *Attorney, Agent, or Firm* — Sughrue Mion, PLLC

(57) ABSTRACT

A first stack-structured light-emitting element includes light-emitting units and a first charge generation layer between the light-emitting units. A second stack-structured light-emitting element includes light-emitting units and a second charge generation layer between the light-emitting units. Each of the first and second charge generation layers consists of one or more charge generation component layers. A first end region of the first charge generation layer and a second end region of the second charge generation layer overlap above the top face of the element separation layer. In the overlap region, an end region of a component layer of the first or second stack-structured light-emitting element configured to block charges of either polarity is interposed between charge generation component layers of the first and second charge generation layers configured to generate charges of the same polarity as the charges to be blocked by the component layer.

8 Claims, 21 Drawing Sheets

(51) Int. Cl.
  *H01L 51/56* (2006.01)
  *H10K 50/13* (2023.01)
  *H10K 50/15* (2023.01)
  *H10K 50/16* (2023.01)
  *H10K 50/19* (2023.01)
  *H10K 59/122* (2023.01)
  *H10K 59/32* (2023.01)
  *H10K 59/35* (2023.01)
  *H10K 71/00* (2023.01)

(52) U.S. Cl.
  CPC ........... *H10K 50/19* (2023.02); *H10K 59/122* (2023.02); *H10K 59/35* (2023.02); *H10K 71/00* (2023.02)

(56) References Cited

U.S. PATENT DOCUMENTS

| | | | |
|---|---|---|---|
| 11,282,896 B2* | 3/2022 | Kim | H10K 59/35 |
| 11,302,757 B2* | 4/2022 | Shim | H10K 59/122 |
| 2015/0357388 A1 | 12/2015 | Pang | |
| 2017/0352707 A1* | 12/2017 | Kim | H10K 59/32 |
| 2018/0102499 A1* | 4/2018 | Pyo | H10K 59/879 |
| 2018/0190731 A1* | 7/2018 | Park | G09G 3/20 |
| 2019/0326542 A1* | 10/2019 | Yang | H10K 59/32 |
| 2020/0043983 A1* | 2/2020 | Kim | H10K 50/131 |
| 2020/0044177 A1* | 2/2020 | Kim | H10K 59/30 |
| 2020/0144342 A1* | 5/2020 | Shim | H10K 50/15 |
| 2021/0098733 A1* | 4/2021 | Baik | H10K 59/123 |
| 2021/0175296 A1* | 6/2021 | Liu | H10K 50/13 |
| 2021/0202610 A1* | 7/2021 | Ryu | H10K 50/11 |
| 2023/0130009 A1* | 4/2023 | Lee | H10K 71/00 257/40 |

* cited by examiner

OLED LIGHT-EMITTING DEVICE, DISPLAY DEVICE, ELECTRONIC DEVICE, AND METHOD OF MANUFACTURING OLED LIGHT-EMITTING DEVICE

CROSS-REFERENCE TO RELATED APPLICATIONS

This non-provisional application claims priority under 35 U.S.C. § 119(a) on Patent Application No. 2020-196351 filed in Japan on Nov. 26, 2020 and Patent Application No. 2021-157700 filed in Japan on Sep. 28, 2021, the entire contents of which are hereby incorporated by reference.

BACKGROUND

This disclosure relates to an OLED light-emitting device.

An organic light-emitting diode (OLED) element is a current-driven self-light-emitting element and therefore, does not need a backlight. In addition to this, the OLED element has advantages for achievement of low power consumption, wide viewing angle, and high contrast ratio; it is expected to contribute to development of light-emitting devices such as flat panel display devices and light source devices.

There is a known structure such that a plurality of OLED-structured light-emitting units for emitting the same color or different colors of light are stacked. Stacking light-emitting units for the same color of light provides an OLED light-emitting device with a longer life and higher brightness. Stacking a red light emitting unit, a blue light emitting unit, and a green light emitting unit makes a white light emitting element. Such light-emitting elements (pixels) having a stack structure are disclosed in US 2015/0357388 A and US 2018/0190731 A, for example.

SUMMARY

An aspect of this disclosure is an OLED light-emitting device including: an element separation layer having openings defining light-emitting regions and a top face between the openings; lower electrodes exposed inside the openings; a first stack-structured light-emitting element disposed on a first lower electrode of the lower electrodes; and a second stack-structured light-emitting element disposed on a second lower electrode of the lower electrodes adjacent to the first lower electrode, the second stack-structured light-emitting element being adjacent to the first stack-structured light-emitting element. The first stack-structured light-emitting element includes a first light-emitting unit and a second light-emitting unit stacked above the element separation layer and a first charge generation layer located between the first light-emitting unit and the second light-emitting unit. Each of the first light-emitting unit and the second light-emitting unit includes a light-emitting layer. The first charge generation layer is configured to supply the first light-emitting unit with charges of one polarity and supply the second light-emitting unit with charges of the other polarity. The second stack-structured light-emitting element includes a third light-emitting unit and a fourth light-emitting unit stacked above the element separation layer and a second charge generation layer located between the third light-emitting unit and the fourth light-emitting unit. Each of the third light-emitting unit and the fourth light-emitting unit includes a light-emitting layer. The second charge generation layer is configured to supply the third light-emitting unit with charges of the one polarity and supply the fourth light-emitting unit with charges of the other polarity. Each of the first charge generation layer and the second charge generation layer consists of one or more charge generation component layers. A first end region of the first charge generation layer and a second end region of the second charge generation layer overlap above the top face of the element separation layer. In the overlap region of the first end region and the second end region, an end region of a component layer of the first stack-structured light-emitting element or the second stack-structured light-emitting element configured to block charges of either polarity is interposed between charge generation component layers of the first charge generation layer and the second charge generation layer configured to generate charges of the same polarity as the charges to be blocked by the component layer.

An aspect of this disclosure is a method of manufacturing an OLED light-emitting device. The method includes: forming lower electrodes; forming an element separation layer having openings to define light-emitting regions and a top face between openings in such a shape that each lower electrode is exposed from an opening; and forming a first stack-structured light-emitting element and a second stack-structured light-emitting element adjacent to each other above the element separation layer. The first stack-structured light-emitting element includes a first light-emitting unit and a second light-emitting unit stacked above the element separation layer and a first charge generation layer located between the first light-emitting unit and the second light-emitting unit. Each of the first light-emitting unit and the second light-emitting unit includes a light-emitting layer. The first charge generation layer is configured to supply the first light-emitting unit with charges of one polarity and supply the second light-emitting unit with charges of the other polarity. The second stack-structured light-emitting element includes a third light-emitting unit and a fourth light-emitting unit stacked above the element separation layer and a second charge generation layer located between the third light-emitting unit and the fourth light-emitting unit. Each of the third light-emitting unit and the fourth light-emitting unit includes a light-emitting layer. The second charge generation layer is configured to supply the third light-emitting unit with charges of the one polarity and supply the fourth light-emitting unit with charges of the other polarity. Each of the first charge generation layer and the second charge generation layer consists of one or more charge generation component layers. A first end region of the first charge generation layer and a second end region of the second charge generation layer overlap above the top face of the element separation layer. In the overlap region of the first end region and the second end region, an end region of a component layer of the first stack-structured light-emitting element or the second stack-structured light-emitting element configured to block charges of either polarity is interposed between charge generation component layers of the first charge generation layer and the second charge generation layer configured to generate charges of the same polarity as the charges to be blocked by the component layer.

It is to be understood that both the foregoing general description and the following detailed description are exemplary and explanatory and are not restrictive of this disclosure.

EMBODIMENTS

Figure 1:
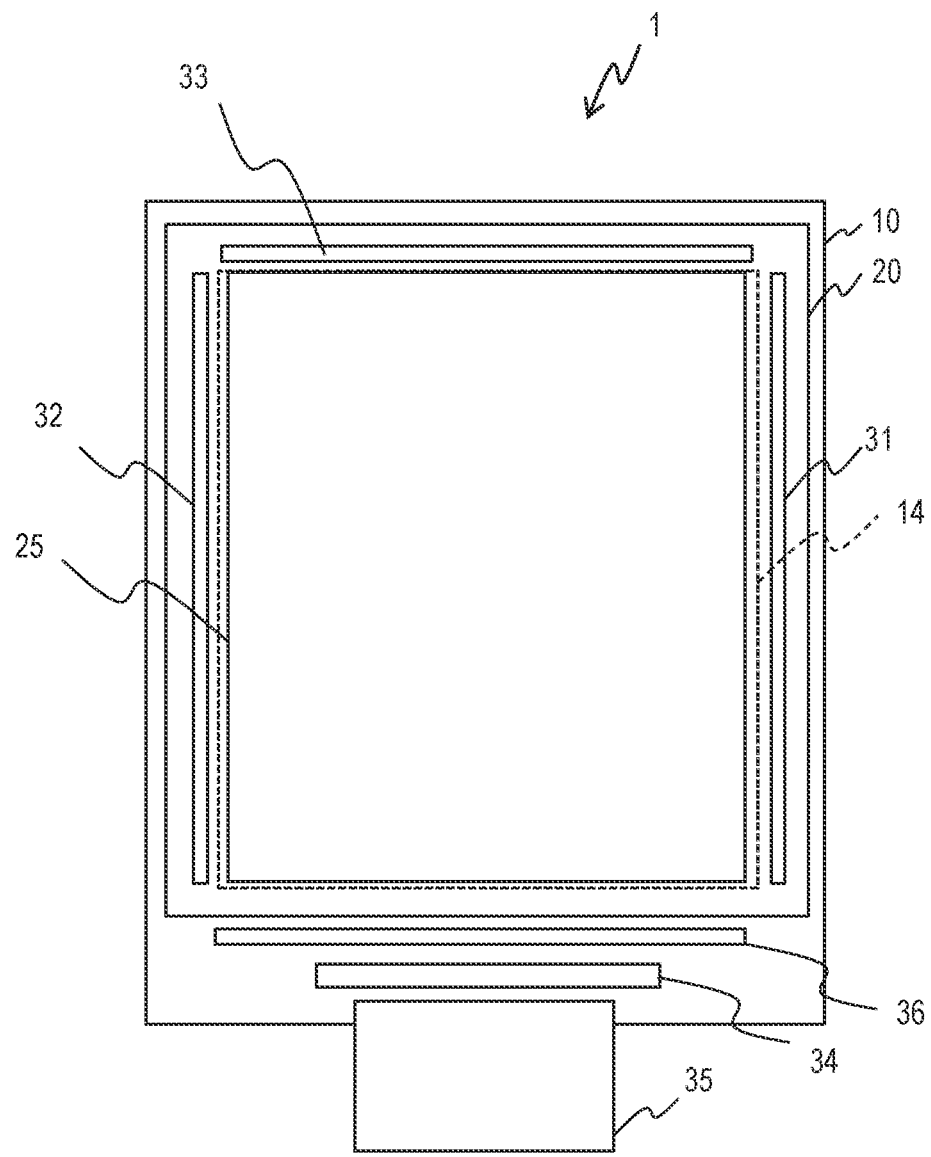
FIG. 1 schematically illustrates a configuration example of an OLED display device.

Hereinafter, embodiments will be described with reference to the accompanying drawings. It should be noted that the embodiments are merely examples to implement this disclosure and are not to limit the technical scope of this disclosure. Elements common to the drawings are denoted by the same reference signs and some elements in the drawings are exaggerated in size or shape for clear understanding of the description.

Hereinafter, an organic light-emitting diode (OLED) light-emitting device is disclosed. The representative example of the OLED light-emitting device is an OLED display device. The OLED display device in an embodiment of this specification includes stack-structured light emitting elements in which a plurality of light-emitting units each having an OLED structure are stacked. In one stack-structured light-emitting element, the plurality of stacked light-emitting units include light-emitting layers for emitting the same color or different colors of light. In this specification, a pixel is a component for emitting a specific color of light to display an image, unless explicitly stated otherwise. The specific color can be red, blue, green, or white. A red pixel, a blue pixel, or a green pixel may be referred to as a subpixel. A stack-structured light emitting element corresponds to one pixel.

A stack-structured light-emitting element includes a charge generation layer between an upper light-emitting unit and a lower light-emitting unit adjacent to each other. The charge generation layer generates charges in response to receiving voltage. The charge generation layer supplies electrons to one light-emitting unit and supplies holes to the other light-emitting unit. When these charges leak to the charge generation layer of an adjacent stack-structured light-emitting element, this micro current makes the adjacent pixel light a little (so-called crosstalk). The following embodiments describe structures of an OLED display device that reduce or prevent this charge leakage.

The display region of an OLED display device in an embodiment includes stack-structured light-emitting elements each corresponding to a pixel. A stack-structured light-emitting element includes a plurality of stacked light-emitting units and further, includes a charge generation layer between the light-emitting units. The charge generation layers of stack-structured light-emitting elements adjacent to each other overlap at their ends above the top face of a pixel defining layer. The pixel defining layer is an example of an element separation layer. In the overlap region of the charge generation layers, an end region of a component layer of a charge generation layer or a light-emitting unit that blocks charges of one polarity is interposed between the component layers of the charge generation layers that generate charges of this polarity. This configuration reduces the charge leakage between charge generation layers.

Configuration of Display Device

FIG. 1 schematically illustrates a configuration example of an OLED display device 1. The OLED display device 1 includes a thin-film transistor (TFT) substrate 10 on which organic light-emitting elements (OLED elements) and pixel circuits are fabricated and a thin-film encapsulation (TFE) 20 for encapsulating the OLED elements. The thin-film encapsulation 20 is an example of a structural encapsulation unit. Another example of the structural encapsulation unit can include an encapsulation substrate for encapsulating the OLED elements and a bond (glass frit sealer) for bonding the TFT substrate 10 with the encapsulation substrate. The space between the TFT substrate 10 and the encapsulation substrate is filled with dry nitrogen, for example.

In the periphery of a cathode electrode region 14 outer than the display region 25 of the TFT substrate 10, a scanning driver 31, an emission driver 32, a protection circuit 33, a driver IC 34, and a demultiplexer 36 are provided. The driver IC 34 is connected to the external devices via flexible printed circuits (FPC) 35. The scanning driver 31, the emission driver 32, and the protection circuit 33 are peripheral circuits fabricated on the TFT substrate 10.

The scanning driver 31 drives scanning lines on the TFT substrate 10. The emission driver 32 drives emission control lines to control the light emission periods of pixels. The driver IC 34 is mounted with an anisotropic conductive film (ACF), for example.

The protection circuit 33 protects the elements in the pixel circuits from electrostatic discharge. The driver IC 34 provides power and timing signals (control signals) to the scanning driver 31 and the emission driver 32 and further, provides power and a data signal to the demultiplexer 36.

The demultiplexer 36 outputs output of one pin of the driver IC 34 serially to d data lines (d is an integer greater than 1). The demultiplexer 36 changes the output data line for the data signal from the driver IC 34 d times per scanning period to drive d times as many data lines as output pins of the driver IC 34.

Configuration of Stack-Structured Light-Emitting Elements

Figure 2A:
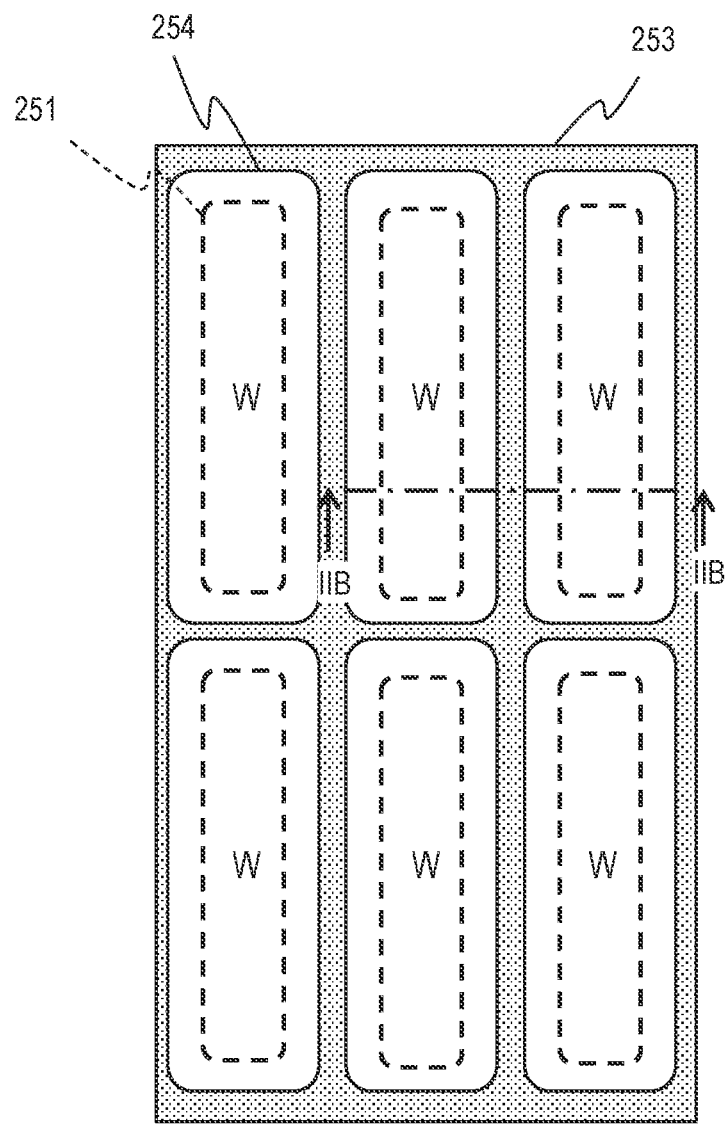
FIG. 2A is a plan diagram of a part of a stack-structured light-emitting element array.

FIG. 2A is a plan diagram of a part of a stack-structured light-emitting element array. FIG. 2A illustrates an example of the layout of stack-structured light-emitting elements in the display region 25. Each stack-structured light-emitting element in the configuration example of FIG. 2A emits white light. A not-shown color filter can be provided in front of the stack-structured light-emitting elements so that each pixel emits red, blue, or green light. In another configuration example, each stack-structured light-emitting element emits red, blue, or green light. A set of a red pixel, a blue pixel, and a green pixel displays information of one pixel in a video frame.

The stack-structured light-emitting elements in FIG. 2A have rounded rectangular light-emitting regions 251 and they are disposed in a matrix. One of the light-emitting regions of the stack-structured light emitting elements is provided with a reference sign 251 by way of example. The shapes and the layout of the light-emitting regions of the stack-structured light-emitting elements are determined desirably.

Each light-emitting region 251 is surrounded by an insulative pixel defining layer 253. The pixel defining layer 253 defines individual pixels (light-emitting regions 251). Each light-emitting region 251 is provided within an opening 254 of the pixel defining layer 253. In FIG. 2A, one of the openings is provided with a reference sign 254 by way of example. The region between openings 254 is the top face of the pixel defining layer 253.

As will be described later, each light-emitting region 251 is the region of an anode electrode exposed at the bottom of an opening 254. In the example of FIG. 2A, the wall defining an opening of the pixel defining layer 253 is tapered and the area of the opening decreases toward the bottom.

Figure 2B:
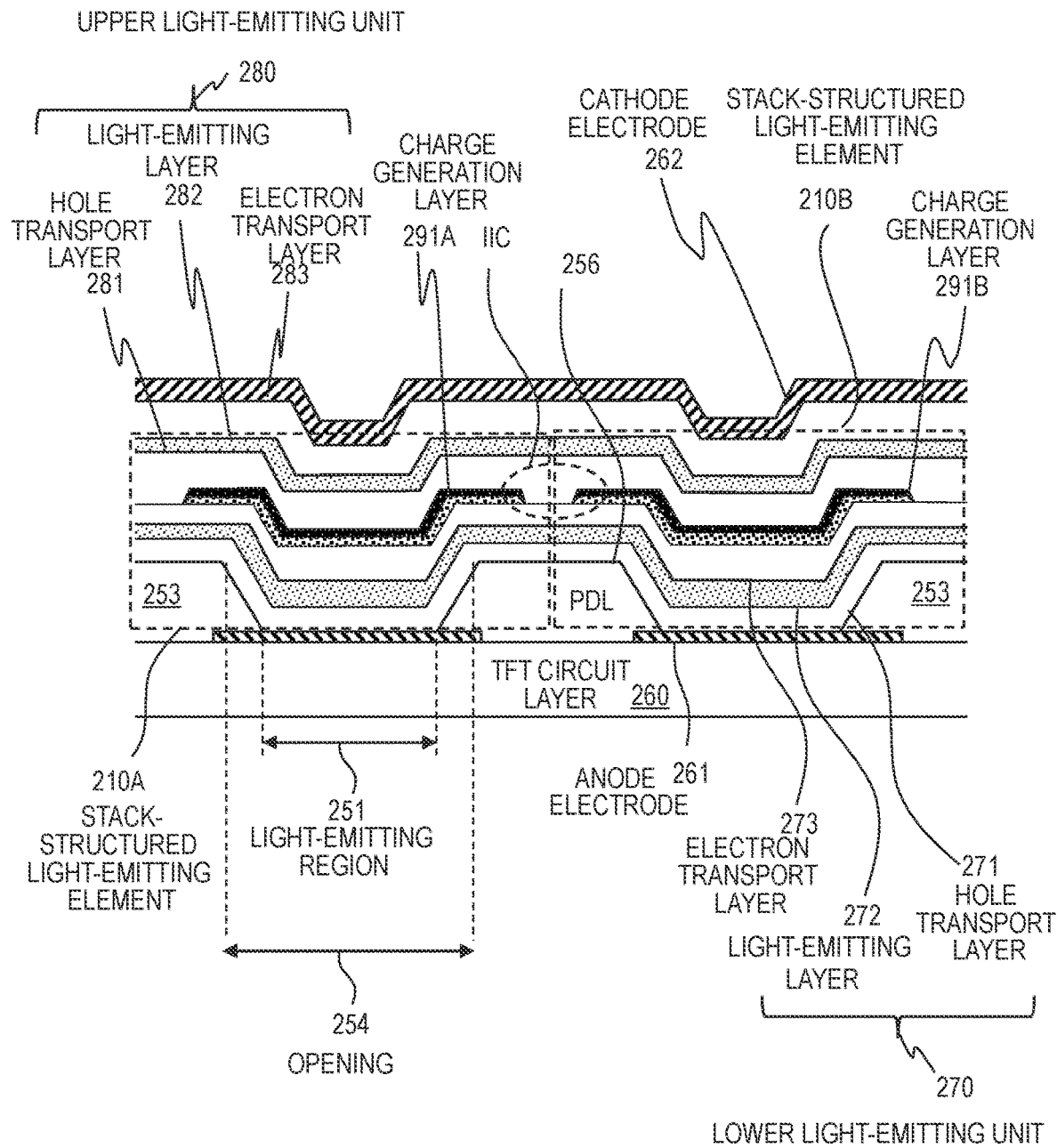
FIG. 2B schematically illustrates a cross-sectional structure along the section line IIB-IIB in FIG. 2A.

FIG. 2B schematically illustrates a cross-sectional structure along the section line IIB-IIB in FIG. 2A. FIG. 2B illustrates a layered structure of a given pair of stack-structured light-emitting elements 210A and 210B adjacent to each other. Each of the stack-structured light emitting elements 210A and 210B is disposed on an anode electrode exposed from an opening 254 of the pixel defining layer 253. Each of the stack-structured light emitting elements 210A and 210B includes a plurality of stacked light-emitting units and a charge generation layer between the light-emitting units.

In the example of FIG. 2B, each of the stack-structured light emitting elements 210A and 210B includes two light-emitting units stacked one above the other. An upper light emitting unit 280 is located above a lower light-emitting unit 270. In FIG. 2B, one of the upper light-emitting units and one of the lower light-emitting units are provided with a reference sign by way of example. The lower light-emitting unit 270 and the upper light-emitting unit 280 can be configured to emit different colors of light, for example, blue light and yellow green light. The lower light-emitting unit 270 and the upper light-emitting unit 280 can be configured to emit the same white color of light.

A charge generation layer is provided between the upper light-emitting unit 280 and the lower light-emitting unit 270. The charge generation layers 291A and 291B of the stack-structured light-emitting elements 210A and 210B each have interfaces with the upper light-emitting unit 280 and the lower light-emitting unit 270. Each of the charge generation layers 291A and 291B consists of two component layers (charge generation component layers). Details of the configuration of the charge generation layers 291A and 291B will be described later.

The stack-structured light-emitting element 210A is an example of a first stack-structured light-emitting element. The lower light-emitting unit 270, the charge generation layer 291A, and the upper light-emitting unit 280 of the stack-structured light-emitting element 210A are examples of a first light-emitting unit, a first charge generation layer, and a second light-emitting unit, respectively. The stack-structured light-emitting element 210B is an example of a second stack-structured light-emitting element. The lower light-emitting unit 270, the charge generation layer 291B, and the upper light-emitting unit 280 of the stack-structured light-emitting element 210B are examples of a third light-emitting unit, a second charge generation layer, and a fourth light-emitting unit, respectively.

As illustrated in FIG. 2B, the OLED display device 1 includes a TFT circuit layer (TFT array) 260 disposed on an insulating substrate and a plurality of separate lower electrodes, for example, anode electrodes 261. The anode electrodes 261 reflect light from the light-emitting units. The OLED display device 1 further includes an upper electrode, for example, a cathode electrode 262. The cathode electrode 262 transmits light from the light-emitting units. The cathode electrode 262 of one pixel can be a part of one electrode film. The locational relation between the anode electrodes and the cathode electrode can be opposite from the one in this example. In such a configuration, the polarity of each layer is to be opposite.

The insulating substrate is a flexible or inflexible substrate made of resin or glass, for example. The side closer to the insulating substrate is defined as lower side and the side farther from the insulating substrate as upper side. The stack-structured light-emitting elements are disposed between the cathode electrode 262 and the anode electrodes 261. The plurality of anode electrodes 261 are disposed on a plane (for example, a planarization film) of the TFT circuit layer 260 and one stack-structured light-emitting element is disposed above one anode electrode 261.

The cathode electrode 262 is a transparent (including semi-transparent) electrode that transmits all or a part of visible light from organic light-emitting layers toward the structural encapsulation unit. The cathode electrodes 262 of individual pixels are different parts of an unseparated sheet of conductive film. A not-shown cap layer can be provided over the cathode electrode 262.

The TFT circuit layer 260 includes a plurality of pixel circuits each including a plurality of TFTs. Each pixel circuit is fabricated between the insulating substrate and an anode electrode 261 to control electric current to be supplied to the anode electrode 261, which is connected with the pixel circuit through a contact provided in a contact hole in a not-shown planarization film. Pixel circuits having a desirable configuration can be employed. An example of a pixel circuit includes a switch TFT for selecting the pixel, a driving TFT for the OLED element, a switch TFT for controlling supply/stop of the driving current to the OLED element, and a storage capacitor.

A pixel defining layer 253 is provided to cover the peripheries of the anode electrodes 261. A part of an anode electrode 261 including its center is located (and exposed) within an opening 254 of the pixel defining layer 253. The region of the anode electrode 261 located within the opening 254 corresponds to a light-emitting region 251. A stack-structured light-emitting element is laid above the anode electrode 261 in the region within the opening 254.

A lower light-emitting unit 270 includes a hole transport layer 271, a light-emitting layer 272, and an electron transport layer 273. The hole transport layer 271, the light-emitting layer 272, and the electron transport layer 273 are laid in this order from the bottom. In the configuration example of FIG. 2B, the hole transport layer 271 is in contact with the anode electrode 261 and has an interface with it. The light-emitting layer 272 in this example emits blue light. These layers can be made of any material as appropriate.

The hole transport layer 271, the light-emitting layer 272, and the electron transport layer 273 in the configuration example of FIG. 2B are parts of unseparated films including those layers of a plurality of lower light-emitting units 270. The hole transport layer 271 and/or the electron transport layer 273 are optional. The lower light-emitting unit 270 can have a different layered structure. Another functional layer such as a hole injection layer can be included between the anode electrode 261 and the hole transport layer 271.

An upper light-emitting unit 280 includes a hole transport layer 281, a light-emitting layer 282, and an electron transport layer 283. The hole transport layer 281, the light-emitting layer 282, and the electron transport layer 283 are laid in this order from the bottom. In the configuration example of FIG. 2B, the electron transport layer 283 is in contact with the cathode electrode 262 and has an interface with it. The light-emitting layer 282 in this example emits yellow green light. These layers can be made of any material as appropriate.

The hole transport layer 281, the light-emitting layer 282, and the electron transport layer 283 in the configuration example of FIG. 2B are parts of unseparated films including those layers of a plurality of upper light-emitting units 280. The hole transport layer 281 and/or the electron transport layer 283 are optional. The upper light-emitting unit 280 can have a different layered structure. Another functional layer such as an electron injection layer can be included between the cathode electrode 262 and the electron transport layer 283.

Charge generation layers 291A and 291B are each laid between a lower light-emitting unit 270 and an upper light-emitting unit 280. The charge generation layers 291A and 291B are in contact with the electron transport layer 273 of the lower light-emitting unit 270 and the hole transport layer 281 of the upper light-emitting unit 280 and have interfaces with them.

As will be described later, a charge generation layer can consist of a single component layer or multiple component layers. A component layer of a charge generation layer can be an electron generation layer that generates only electrons, a hole generation layer that generates only holes, or an electron and hole generation layer that generates electrons and holes. Various materials are known for these component layers and any of such materials can be employed. For example, an organic compound or an inorganic compound such as $V_2O_5$, $Re_2O_7$, or ITO can be used. The hole transport layers or hole injection layers in light-emitting units for different colors of light can have different thicknesses.

The pixel defining layer 253 is a layer between the anode electrode 261 and the hole transport layer 271 of the lower light-emitting unit 270. The pixel defining layer 253 includes inner walls of the openings 254 where the light-emitting regions 251 of the stack-structured light-emitting elements are provided and a top face 256 between openings 254. The top face 256 in the example of FIG. 2B is flat.

As illustrated in FIG. 2B, the charge generation layers 291A and 291B are separate. More specifically, the charge generation layers 291A and 291B cover their corresponding openings 254 of the pixel defining layer 253 and their ends are located above the top face 256 of the pixel defining layer 253. Their opposed ends are distant in an in-plane direction (a direction within the principal face of the substrate). In other words, there is a gap in an in-plane direction between an end of the charge generation layer 291A and an end of the charge generation layer 291B. The gap is filled with the material of the hole transport layer 281.

Figure 2C:
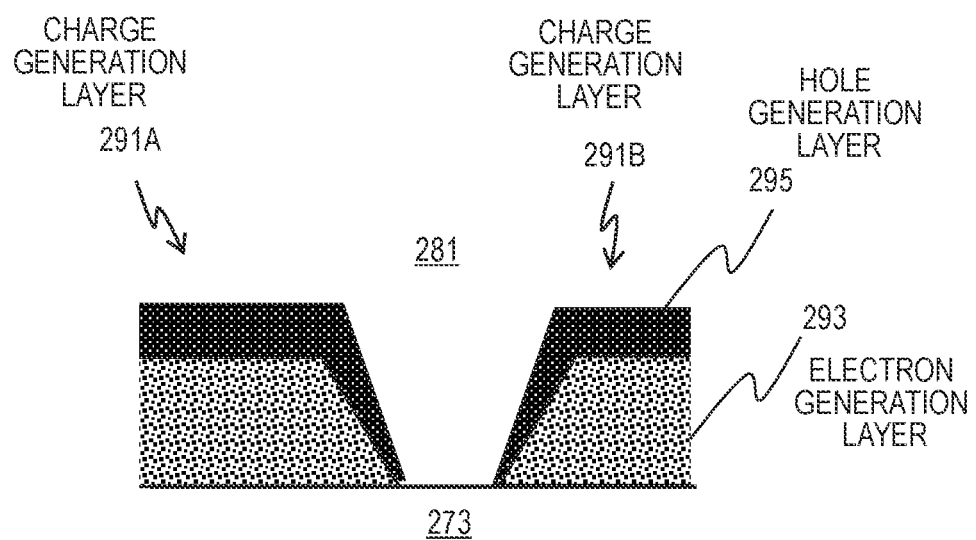
FIG. 2C is an enlarged diagram of the part encircled by a dashed line IIC in FIG. 2B.

FIG. 2C is an enlarged diagram of the part encircled by a dashed line IIC in FIG. 2B. Each of the charge generation layers 291A and 291B consists of a plurality of layers. Specifically, they have a double layer structure and include a lower electron generation layer 293 and an upper hole generation layer 295.

The charge generation layers 291A and 291B have the identical structures. Their electron generation layers 293 are made of the same material and their hole generation layers 295 are made of the same material. In FIG. 2C, the electron generation layer and the hole generation layer of the charge generation layer 291B are provided with reference signs 293 and 295, respectively, by way of example. Each electron generation layer 293 supplies electrons to the lower light-emitting unit 270 and each hole generation layer 295 supplies holes to the upper light-emitting unit 280.

The charge generation layers 291A and 291B are provided to partially cover the top face 256 of the pixel defining layer 253 surrounding them. The charge generation layers 291A and 291B are provided above only a part of the top face 256; the ends of the charge generation layers 291A and 291B are located above the top face 256 of the pixel defining layer 253. Each electron generation layer 293 is covered with a hole generation layer 295. The ends of the charge generation layers 291A and 291B are distant from each other in an in-plane direction and there is a gap therebetween.

Separation of the charge generation layers 291A and 291B reduces the leakage current therebetween. Since the ends of the charge generation layers 291A and 291B are located above the top face 256 of the pixel defining layer 253, the charge generation layers 291A and 291B can supply charges more appropriately to the upper and the lower light-emitting units of the stack-structured light-emitting elements.

The end region of the charge generation layer 291A and the end region of the charge generation layer 291B are tapered above the top face 256 of the pixel defining layer 253. The end regions of the electron generation layers 293 and the hole generation layers 295 are tapered. The tapered charge generation layers can break the leak path because of their small thicknesses even if the films overlap because of misalignment in film formation.

In the configuration example illustrated in FIGS. 2A and 2B, the light-emitting layers of the lower light-emitting units of adjacent stack-structured light-emitting elements are for the same color of light and they are unseparated. The light-emitting layers of the upper light-emitting units of adjacent stack-structured light-emitting elements are for the same color of light and they are unseparated. The light-emitting layers of the lower light-emitting units and the light emitting layers of the upper light-emitting units emit different colors of light. In another configuration example, adjacent stack-structured light-emitting elements can include light-emitting layers for different colors of light. For example, one stack-structured light-emitting element emits red, blue, or green light and another stack-structured light-emitting element emits light of a different color among the three. In the case of this configuration, the light-emitting layers for different colors of light in adjacent lower light-emitting units are separate in an in-plane direction and the light-emitting layers for different colors in adjacent upper light-emitting units are separate in an in-plane direction, like the charge generation layers illustrated in FIGS. 2A and 2B.

Figure 3A:
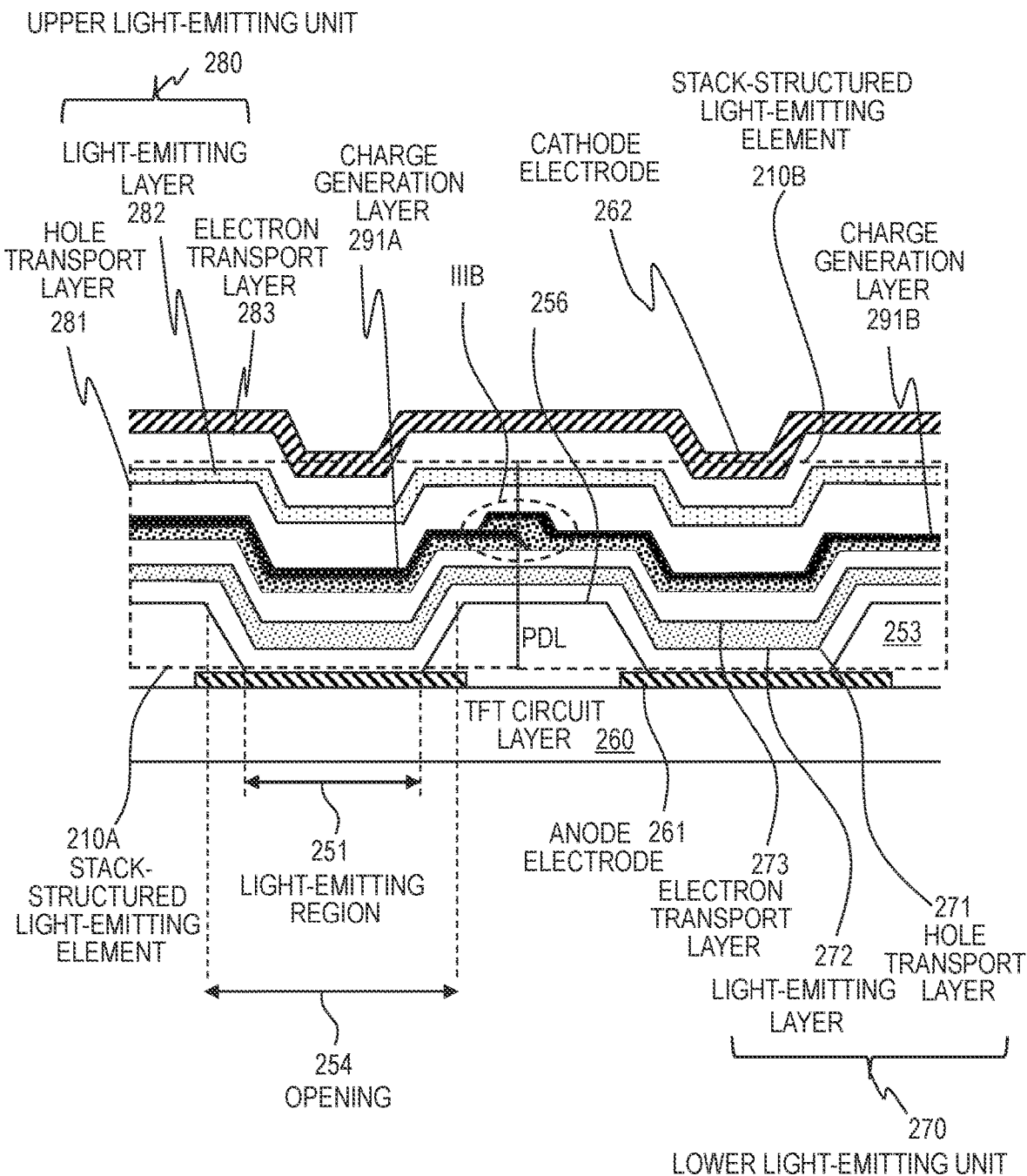
FIG. 3A is a cross-sectional diagram illustrating another configuration example of the charge generation layers of stack-structured light-emitting elements adjacent to each other.

FIG. 3A is a cross-sectional diagram illustrating another configuration example of the charge generation layers 291A and 291B of stack-structured light-emitting elements 210A and 210B adjacent to each other. The following mainly describes differences from the configuration example of FIG. 2B. In the configuration example in FIG. 3A, the charge generation layer 291A and the charge generation layer 291B overlap at their ends above the top face 256 of the pixel defining layer 253. This configuration eliminates the gap for separating the stack-structured light-emitting elements, enabling an OLED display device to have higher resolution.

Figure 3B:
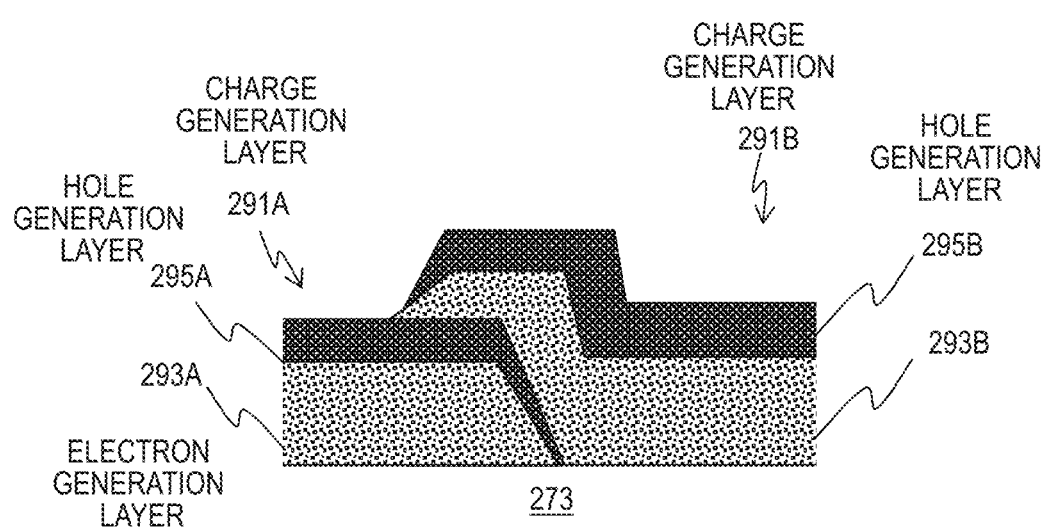
FIG. 3B is an enlarged diagram of the part encircled by a dashed line IIIB in FIG. 3A.

FIG. 3B is an enlarged diagram of the part encircled by a dashed line IIIB in FIG. 3A. Each of the charge generation layers 291A and 291B has a double-layer structure. The charge generation layer 291A consists of a lower electron generation layer 293A and an upper hole generation layer 295A. The charge generation layer 291B consists of a lower electron generation layer 293B and an upper hole generation layer 295B.

An end region of the charge generation layer 291B is laid above an end region of the charge generation layer 291A. Specifically, an end region of the electron generation layer 293B is laid above an end region of the hole generation layer 295A of the charge generation layer 291A. These are in contact with each other to have an interface. This layered structure of the end regions consists of the electron generation layer 293A, the hole generation layer 295A, the electron generation layer 293B, and the hole generation layer 295B laid in this order from the bottom.

The end region of the charge generation layer 291A and the end region of the charge generation layer 291B are tapered above the top face 256 of the pixel defining layer 253. The end regions of the electron generation layer 293A and the hole generation layer 295A are tapered. The end regions of the electron generation layer 293B and the hole generation layer 295B are also tapered. The tapered charge generation layers can break the leak path.

The hole generation layer 295A is located between the electron generation layer 293A of the charge generation layer 291A and the electron generation layer 293B of the charge generation layer 291B. The hole generation layer 295A is in contact with the electron generation layers 293A and 293B and has interfaces with them. The electron generation layers 293A and 293B are not in direct contact with each other and separated by the hole generation layer 295A.

The electron generation layer 293B is located between the hole generation layer 295A of the charge generation layer 291A and the hole generation layer 295B of the charge generation layer 291B. The electron generation layer 293B is in contact with the hole generation layers 295A and 295B and has interfaces with them. The hole generation layers 295A and 295B are not in direct contact with each other and separated by the electron generation layer 293B.

The electron generation layers 293A and 293B supply and transport electrons but block holes without transmitting them. On the other hand, the hole generation layers 295A and 295B supply and transport holes but block electrons without transmitting them. That is to say, the electron generation layers 293A and 293B transmit only electrons between the charges of two different polarities and the hole generation layers 295A and 295B transmit only holes between the charges of two different polarities.

In summary, in the overlap region of the charge generation layers adjacent to each other, an end region of a component layer of the charge generation layer 291A or 291B that generates charges of only one polarity and blocks charges of the other polarity is interposed between charge generation component layers of the charge generation layers 291A and 291B that generate charges of the other polarity. This configuration effectively reduces charge leakage between the charge generation layers.

Film Formation Using Metal Mask

The charge generation layer having either configuration described with reference to FIGS. 2A to 3B can be formed by vapor deposition with a metal mask having openings of a specific pattern. The vapor deposition heats the material contained in a vapor deposition source while moving the vapor deposition source. The heated material vaporizes and jets out from a nozzle of the vapor deposition source to the external. The ejected material passes through openings of a metal mask correctly aligned between the vapor deposition source and the target substrate and deposits on the predetermined regions of the target substrate to become a film.

Figure 4:
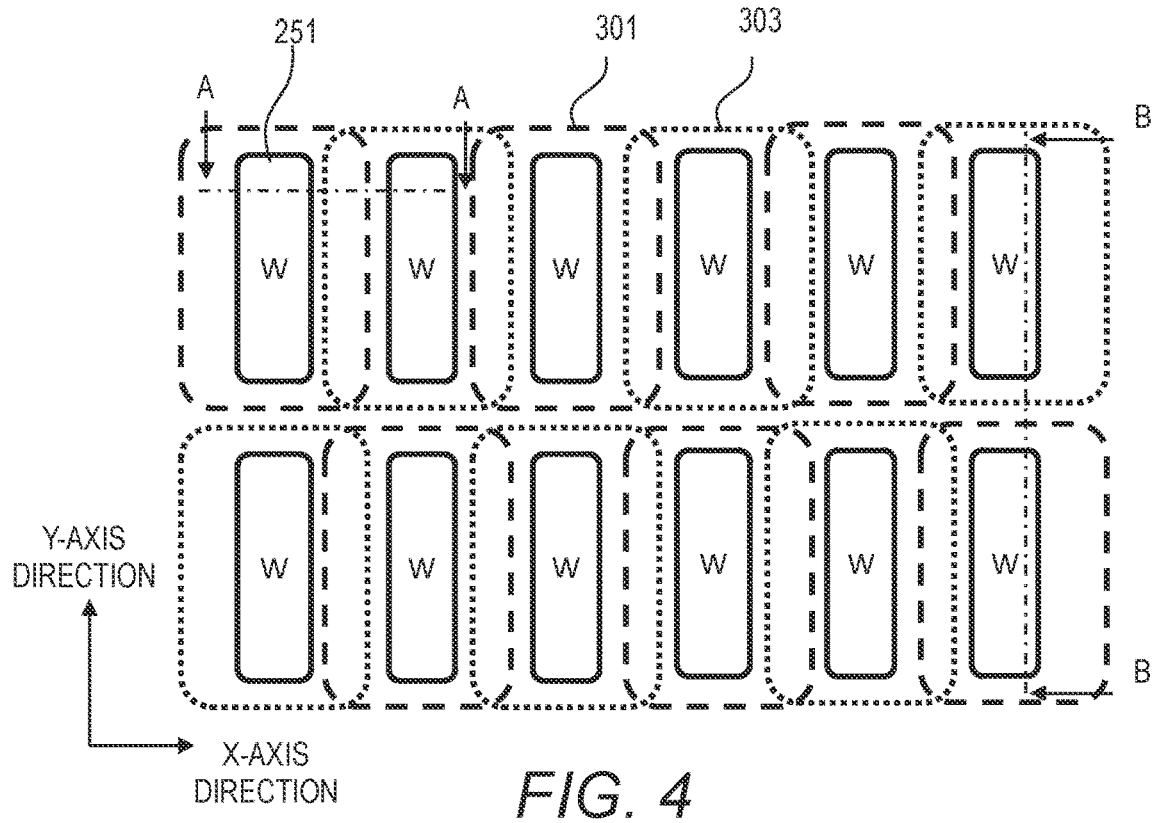
FIG. 4 schematically illustrates a pattern of openings of a metal mask to be used to form a charge generation layer.

FIG. 4 schematically illustrates a pattern of openings of a metal mask to be used to form a charge generation layer. FIG. 4 illustrates states where one metal mask is placed at two different positions.

Rounded rectangles surrounded by dashed lines 301 schematically illustrate the opening pattern of the metal mask placed at the first position. In FIG. 4, one of the rounded rectangles surrounded by dashed lines is provided with a reference sign 301 by way of example. Rounded rectangles surrounded by dotted lines 303 schematically illustrate the opening pattern of the metal mask placed at the second position different from the first position. In FIG. 4, one of the rounded rectangles surrounded by dotted lines is provided with a reference sign 303 by way of example.

The metal mask in FIG. 4 is used for vapor deposition of one component layer, for example, a hole generation layer or an electron generation layer, of the charge generation layer. Each component layer can be formed by vapor deposition in a different chamber by the method described in the following.

An embodiment of this specification places one metal mask at different positions successively and forms a film twice by vapor deposition to form a component layer of a charge generation layer. This method enables production of either the electron generation layer or the hole generation layer of the charge generation layer structured as illustrated in FIG. 3A without preparing two chambers.

In the configuration example of FIG. 4, the openings of the metal mask are laid out in a staggered arrangement. In other words, the opening pattern includes rows of openings aligned along the X-axis (horizontally in FIG. 4) and the opening rows are disposed one above another along the Y-axis (vertically in FIG. 4). The centroids of the openings in one of the two adjacent opening rows are shifted from the centroids of the openings in the other row by a half pitch along the Y-axis. The pitch is the distance between the centroids of the adjacent openings.

An example of forming a component layer of a charge generation layer performs vapor deposition of the material with the metal mask placed at the first position and thereafter, moves the metal mask to the second position and performs vapor deposition of the same material.

In the example of FIG. 4, the positions of the metal mask are determined to satisfy the following. The openings 301 and openings 303 are alternate along the X-axis and also alternate along the Y-axis. An opening 301 and an opening 303 adjacent along the X-axis overlap each other. However, an opening 301 and an opening 303 adjacent along the Y-axis are distant and do not overlap each other. As a result of such positioning, end regions of the charge generation layers of stack-structured light-emitting elements adjacent along the X-axis are laid one above the other and end regions of the charge generation layers of stack-structured light-emitting elements adjacent along the Y-axis are distant.

For example, the cross-section of the part along the section line A-A in FIG. 4 has the cross-sectional structure illustrated in FIG. 3A. The cross-section of the part along the section line B-B in FIG. 4 has the cross-sectional structure illustrated in FIG. 2B.

Figure 5:
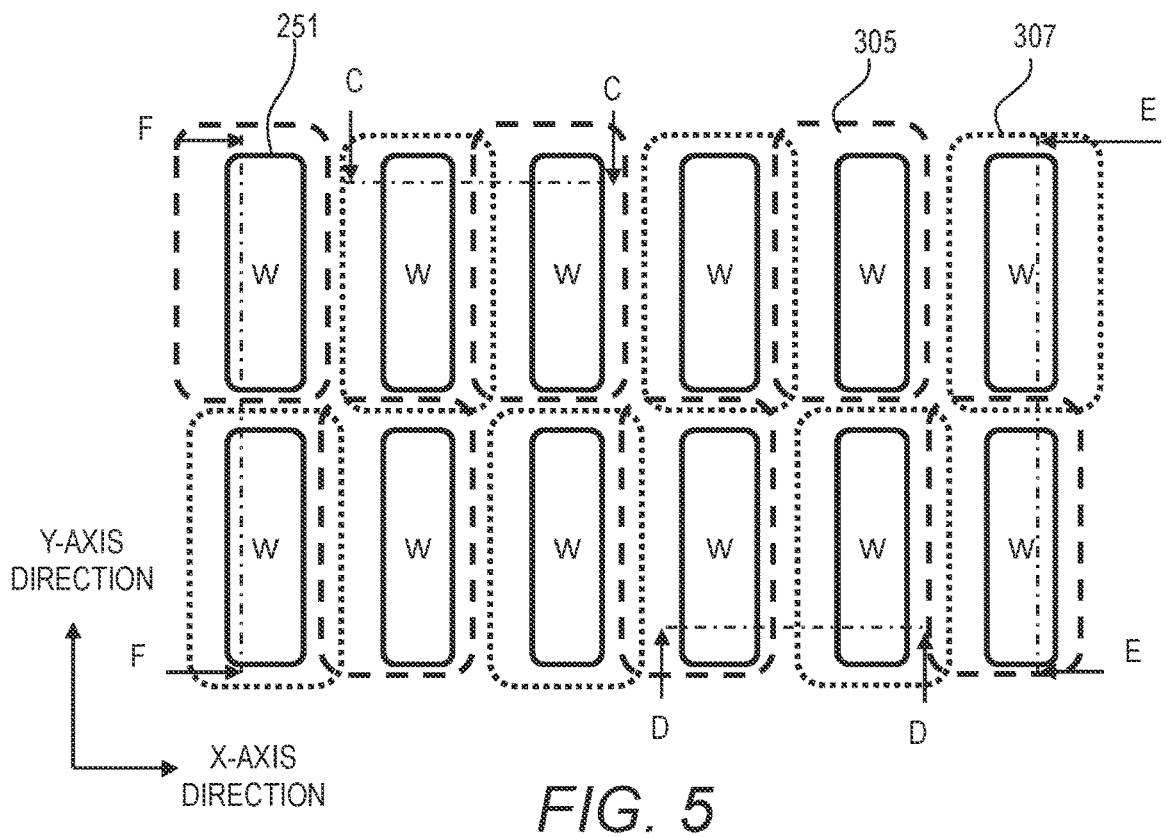
FIG. 5 schematically illustrates another example of the pattern of openings of a metal mask to be used to form a charge generation layer.

FIG. 5 schematically illustrates another example of the pattern of openings of a metal mask to be used to form a charge generation layer. FIG. 5 illustrates states where one metal mask is placed at two different positions.

Rounded rectangles surrounded by dashed lines 305 schematically illustrate the opening pattern of the metal mask placed at the first position. In FIG. 5, one of the rounded rectangles surrounded by dashed lines is provided with a reference sign 305 by way of example. Rounded rectangles surrounded by dotted lines 307 schematically illustrate the opening pattern of the metal mask placed at the second position different from the first position. In FIG. 5, one of the rounded rectangles surrounded by dotted lines is provided with a reference sign 307 by way of example.

The openings of the metal mask illustrated in FIG. 5 are laid out in a staggered arrangement, like those in the configuration example of FIG. 4. In the example of FIG. 5, the positions of the metal mask are determined to satisfy the following. The openings 305 and openings 307 are alternate along the X-axis and also, alternate along the Y-axis.

Among the pairs of an opening 305 and an opening 307 adjacent along the X-axis, the openings of some pairs overlap each other whereas the openings of the other pairs are distant from each other and no overlap exists therebetween. Among the pairs of an opening 305 and an opening 307 adjacent along the Y-axis, the openings of some pairs overlap each other whereas the openings of the other pairs are distant from each other and no overlap exists therebetween.

As a result of such positioning, stack-structured light-emitting element pairs whose charge generation layers are laid one above the other at their ends and stack-structured light-emitting element pairs whose charge generation layers are distant from each other are produced. According to the configuration example of FIG. 5, each opening 305 overlaps one of the openings 307 adjacent along the X-axis (the opening 307 on the left) and is distant from the other opening 307 (the opening 307 on the right). Furthermore, each opening 305 overlaps one of the openings 307 adjacent along the Y-axis (the opening 307 on the upper side) and is distant from the other opening 307 (the opening on the lower side).

For example, the cross-sections of the parts along the section lines C-C and E-E in FIG. 5 have the cross-sectional structure illustrated in FIG. 3A. The cross-sections of the parts along the section lines D-D and F-F in FIG. 5 have the cross-sectional structure illustrated in FIG. 2B.

As described with reference to FIGS. 4 and 5, the charge generation layers of stack-structured light-emitting elements adjacent to each other can have different structures depending on the direction. In another configuration example, the charge generation layer of each stack-structured light-emitting element can be distant from or overlap the charge generation layers of all stack-structured light-emitting elements adjacent along the X-axis and the Y-axis.

Method of Manufacturing OLED Display Device

An example of a method of manufacturing the OLED display device 1 is described. In the following description, the elements produced in the same step (together) are elements on the same layer. Manufacturing the OLED display device 1 first fabricates a TFT circuit layer 260 on an insulating substrate. The TFT circuit layer 260 can be manufactured by a known technique and therefore, detailed description is omitted here.

Next, the manufacturing forms anode electrodes above the TFT circuit layer 260. For example, the manufacturing forms anode electrodes 261 on a planarization film having contact holes therethrough. The layer structure and the material of the anode electrodes 261 can be determined desirably. For example, the anode electrodes 261 can be formed by vapor deposition or sputtering of metal material. Each anode electrode 261 is connected to a pixel circuit in the TFT circuit layer 260 via a contact.

Next, the manufacturing forms a pixel defining layer 253 by depositing photosensitive organic resin by spin coating and patterning the photosensitive organic resin. Openings 254 are created in the pixel defining layer 253 by the patterning so that the anode electrodes 261 of individual pixels are exposed at the bottom of the openings 254. Light-emitting regions are separated by the pixel defining layer 253.

Figure 6:
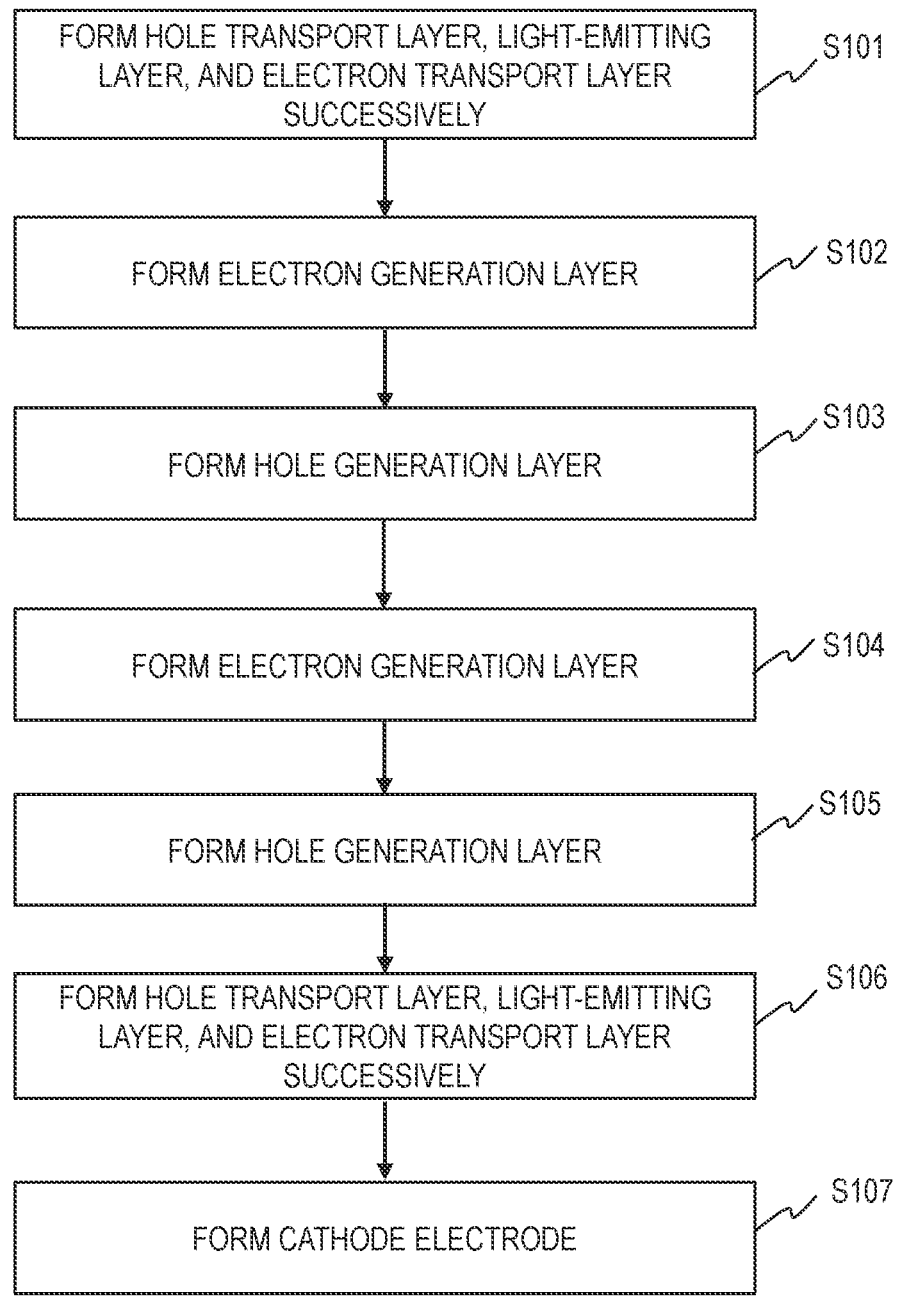
FIG. 6 is a flowchart of a part of manufacturing an OLED display device after forming a pixel defining layer.

Some manufacturing steps subsequent to producing the pixel defining layer 253 are described with reference to the flowchart of FIG. 6. The manufacturing successively forms a hole transport layer 271, a light-emitting layer 272, and an electron transport layer 273 over the whole display region with the pixel defining layer 253 (S101). These layers can be formed by vapor deposition.

Next, the manufacturing forms an electron generation layer 293A by depositing the material for the electron generation layer on the substrate by vapor deposition through a metal mask having the pattern of the electron generation layers 293A and 293B (S102). The electron generation layer 293A is formed by the method described with reference to FIG. 4 or 5.

Next, the manufacturing forms a hole generation layer 295A by depositing the material for the hole generation layer on the substrate by vapor deposition through a metal mask having the pattern of the hole generation layers 295A and 295B (S103). The hole generation layer 295A is formed by the method described with reference to FIG. 4 or 5.

Next, the manufacturing forms an electron generation layer 293B by depositing the material for the electron generation layer on the substrate by vapor deposition through a metal mask having the pattern of the electron generation layers 293A and 293B (S104). The electron generation layer 293B is formed by the method described with reference to FIG. 4 or 5.

Next, the manufacturing forms a hole generation layer 295B by depositing the material for the hole generation layer on the substrate by vapor deposition through a metal mask having the pattern of the hole generation layers 295A and 295B (S105). The hole generation layer 295B is formed by the method described with reference to FIG. 4 or 5.

Next, the manufacturing successively forms a hole transport layer 281, a light-emitting layer 282, and an electron transport layer 283 over the whole display region (S106). These layers can be formed by vapor deposition. Next, the manufacturing deposits metal material for the cathode electrode 262 (S107). The cathode electrode 262 is provided over the whole display region. The layer structure and the material of the cathode electrode 262 are determined desirably. For example, the cathode electrode 262 can be formed by vapor deposition or sputtering of metal material. After producing the cathode electrode 262, a color filter layer and a structural encapsulation unit are formed.

The above-described method is merely an example; the OLED display device can be manufactured by a different method. For example, if the OLED display device is configured to display an image with stack-structured light-emitting elements for emitting red, blue, and green light, the light-emitting layers for these colors of light can be formed by vapor deposition using metal masks for the individual colors of light-emitting layers. The OLED display device having this configuration does not include a color filter.

Other Configuration Examples of Stack-Structured Light-Emitting Elements

Figure 7A:
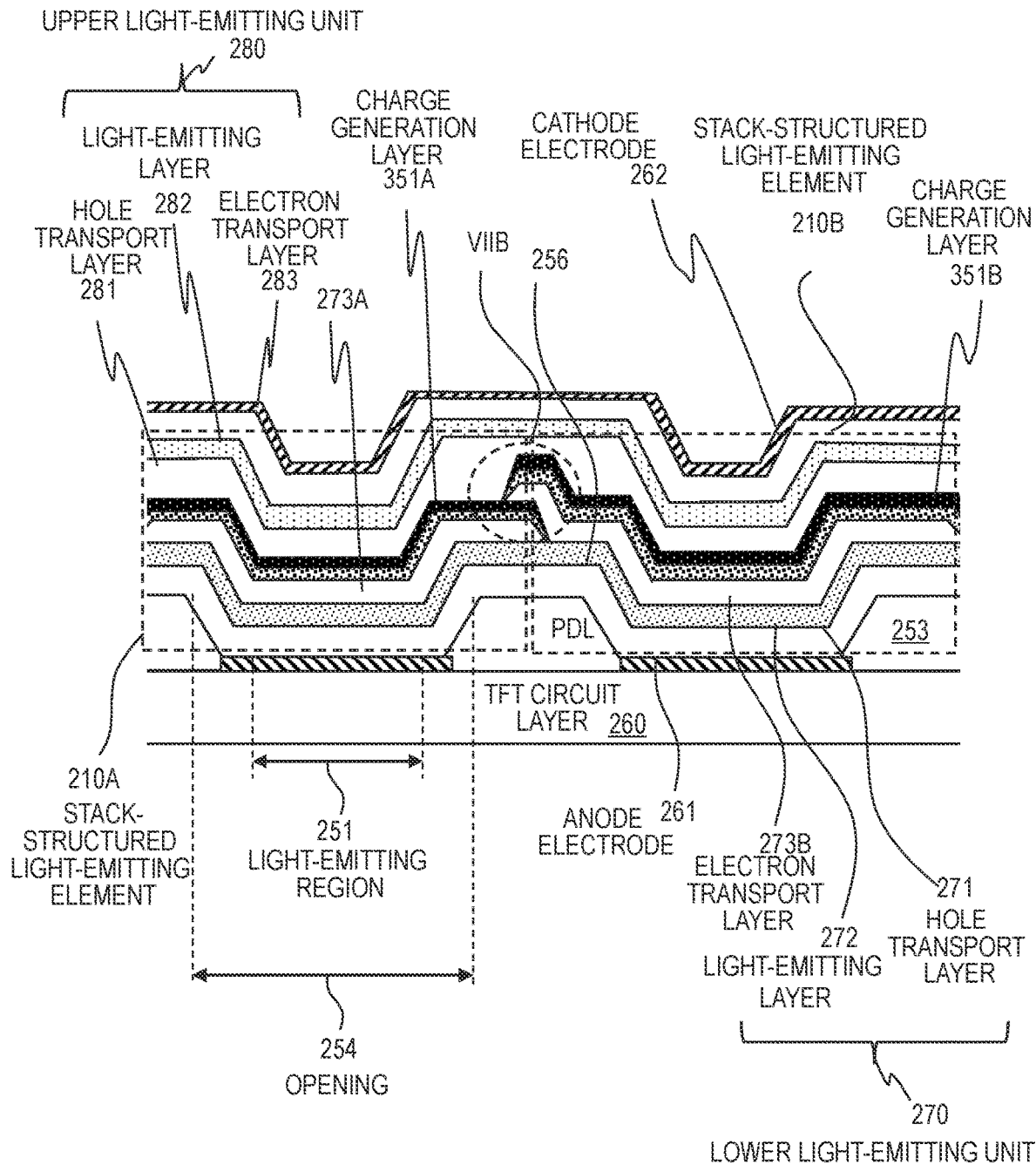
FIG. 7A is a cross-sectional diagram illustrating another configuration example of stack-structured light-emitting elements adjacent to each other.
Figure 7B:
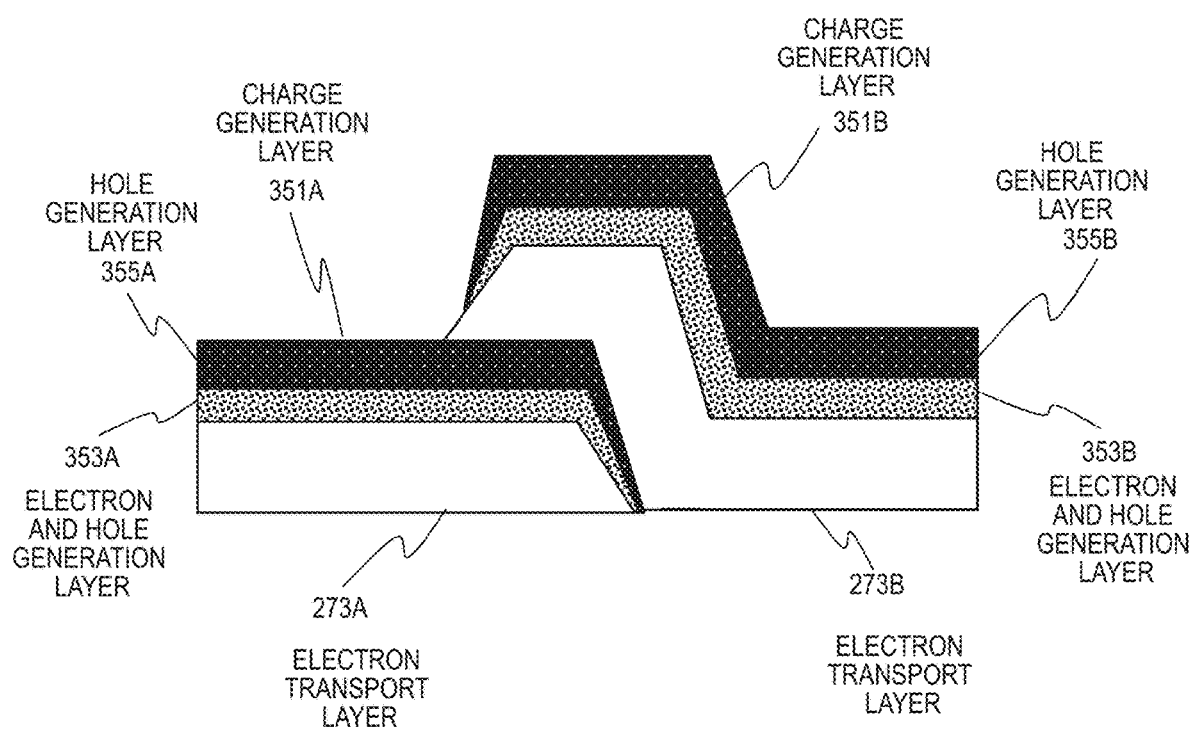
FIG. 7B is an enlarged diagram of the part encircled by a dashed line VIIB in FIG. 7A.

Hereinafter, other configuration examples of stack-structured light-emitting elements are described. Differences from the configuration example described with reference to FIG. 3A are mainly described. FIG. 7A is a cross-sectional diagram illustrating another configuration example of stack-structured light-emitting elements 210A and 210B adjacent to each other. FIG. 7B is an enlarged diagram of the part encircled by a dashed line VIIB in FIG. 7A.

The configuration example illustrated in FIG. 7A includes charge generation layers 351A and 351B in place of the charge generation layers 291A and 291B in FIG. 3A. The charge generation layer 351A and the charge generation layer 351B overlap at their ends above the top face 256 of the pixel defining layer 253. This configuration enables the OLED display device to have higher resolution.

Each of the charge generation layers 351A and 351B has a double layer structure and consists of two component layers. Specifically, the charge generation layer 351A consists of a lower electron and hole generation layer 353A and an upper hole generation layer 355A. In similar, the charge generation layer 351B consists of a lower electron and hole generation layer 353B and an upper hole generation layer 355B. The electron and hole generation layers 353A and 353B can be made of an alkali metal compound or an alkaline-earth metal compound; they can supply and transport charges (carriers) of both electrons and holes. The hole generation layers 355A and 355B supply and transport only holes.

As illustrated in FIG. 7B, an end region of the charge generation layer 351B is laid above an end region of the charge generation layer 351A. The end region of the charge generation layer 351A is laid above the end region of the electron transport layer 273A of the lower light-emitting unit of the stack-structured light-emitting element 210A. The end region of the charge generation layer 351A and the end region of the charge generation layer 351B are tapered above the top face 256 of the pixel defining layer 253. The end regions of the electron and hole generation layer 353A and the hole generation layer 355A are tapered. The end regions of the electron and hole generation layer 353B and the hole generation layer 355B are also tapered. The tapered charge generation layers can break the leak path.

The end region of the electron transport layer 273B of the lower light-emitting unit of the stack-structured light-emitting element 210B is interposed between the end region of the charge generation layer 351A and the end region of the charge generation layer 351B. The end region of the charge generation layer 351B is laid above the end region of the charge generation layer 351A with the end region of the electron transport layer 273B interposed therebetween. The end region of the electron transport layer 273B is in contact with the end regions of the charge generation layers 351A and 351B and has interfaces with them.

The layered structure of the end regions of the charge generation layers includes the electron and hole generation layer 353A, the hole generation layer 355A, the electron transport layer 273B, the electron and hole generation layer 353B, and the hole generation layer 355B laid in this order from the bottom.

The electron transport layer 273B is located between the hole generation layer 355A of the charge generation layer 351A and the electron and hole generation layer 353B of the charge generation layer 351B. The electron transport layer 273B is in contact with the hole generation layer 355A and the electron and hole generation layer 353B and has interfaces with them. The hole generation layer 355A is not in direct contact with the electron and hole generation layer 353B and these layers are separated by the electron transport layer 273B.

The electron transport layer 273B transmits electrons and blocks holes without transmitting them. Accordingly, the electron transport layer 273B blocks a flow of holes between the electron and hole generation layer 353B and the hole generation layer 355A.

The hole generation layer 355A of the charge generation layer 351A is located between the electron transport layer 273B and the electron and hole generation layer 353A of the charge generation layer 351A. The hole generation layer 355A is in contact with the electron and hole generation layer 353A and the electron transport layer 273B and has interfaces with them. The electron transport layer 273B is not in direct contact with the electron and hole generation layer 353A and these layers are separated by the hole generation layer 355A. Accordingly, the electron and hole generation layer 353A of the charge generation layer 351A is not in direct contact with the electron and hole generation layer 353B of the charge generation layer 351B and these layers are separated by the electron transport layer 273B and the hole generation layer 355A.

The electron transport layer 273B transmits electrons and blocks holes without transmitting them. The hole generation layer 355A blocks a flow of electrons. These layers block flows of electrons and holes between the electron and hole generation layer 353B and the electron and hole generation layer 353A.

The electron transport layer 273B is located between the hole generation layer 355A of the charge generation layer 351A and the hole generation layer 355B of the charge generation layer 351B. The electron transport layer 273B is in contact with the hole generation layer 355A and the electron and hole generation layer 353B and has interfaces with them. The hole generation layer 355A is not in direct contact with the electron and hole generation layer 353B and these layers are separated by the electron transport layer 273B. The electron transport layer 273B blocks a flow of holes between the hole generation layers 355A and 355B.

As described with reference to FIGS. 7A and 7B, an end region of the electron transport layer 273B that blocks holes is interposed between the charge generation component layers 355A and 353B of the charge generation layers 351A and 351B that generate holes. The electron transport layer 273B is a component layer of a light-emitting unit of the stack-structured light-emitting element 210B. The electron and hole generation layers 353A and 353B generate holes and electrons as described with reference to FIGS. 7A and 7B. In addition to the end region of the electron transport layer 273B that blocks holes, an end region of the hole generation layer 355A that blocks electrons is interposed between the electron and hole generation layers 353A and 353B.

As described above, the configuration example illustrated in FIGS. 7A and 7B effectively reduces the charge leakage at the part where end regions of charge generation layers adjacent to each other are layered.

The layered structure illustrated in FIGS. 7A and 7B can be produced by separately depositing the electron transport layer of the lower light-emitting unit and the charge generation layer. For example, the manufacturing places a metal mask at two different positions using an alignment function to form the electron transport layers 273A and 273B, as described in the formation of a charge generation layer. This layered structure is produced by forming the layers in the order of the electron transport layer 273A, the charge generation layer 351A, the electron transport layer 273B, and the charge generation layer 351B. Efficient manufacture of the OLED display device is achieved by using the same metal mask.

Figure 8A:
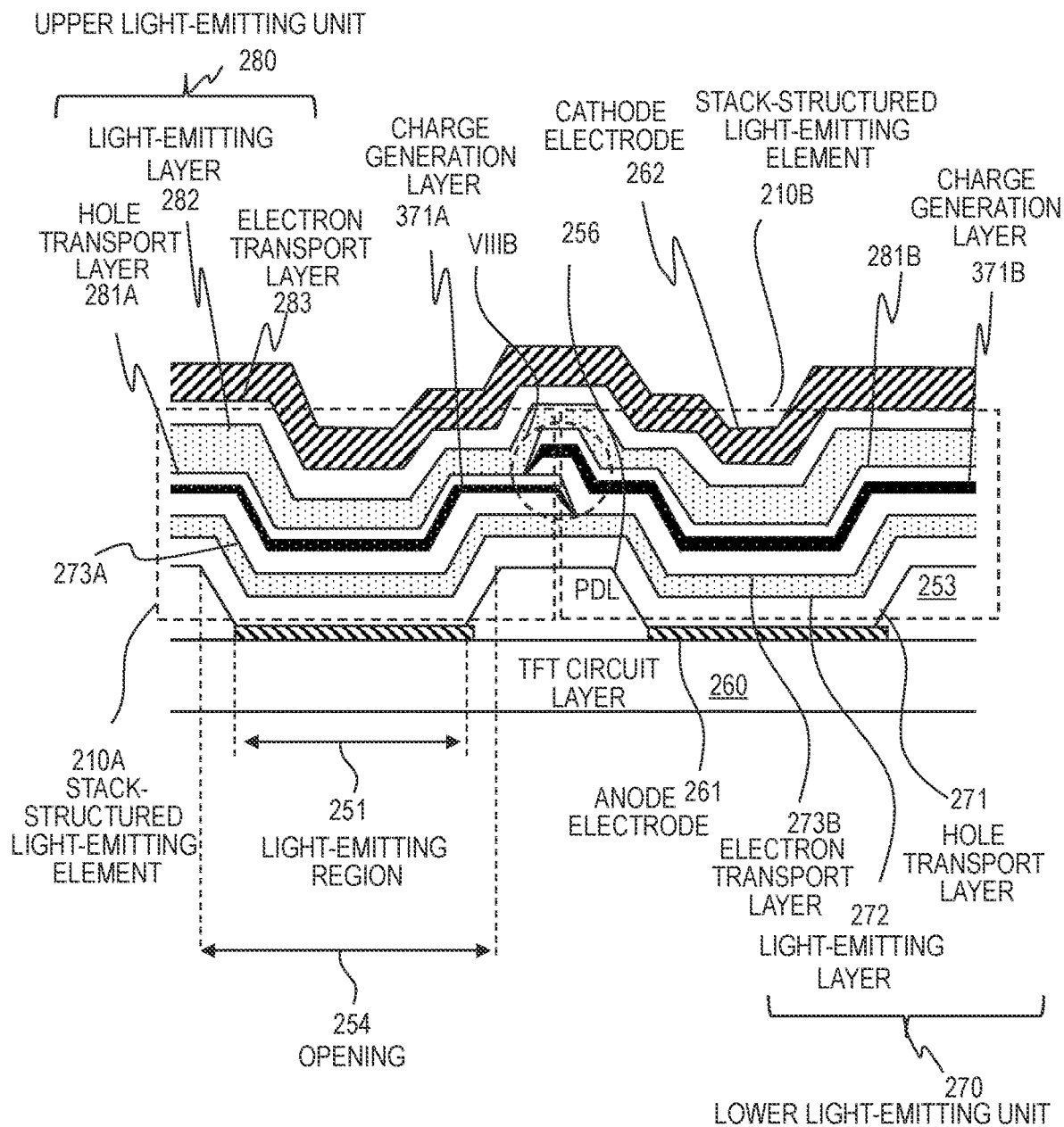
FIG. 8A is a cross-sectional diagram illustrating still another configuration example of stack-structured light-emitting elements adjacent to each other.
Figure 8B:
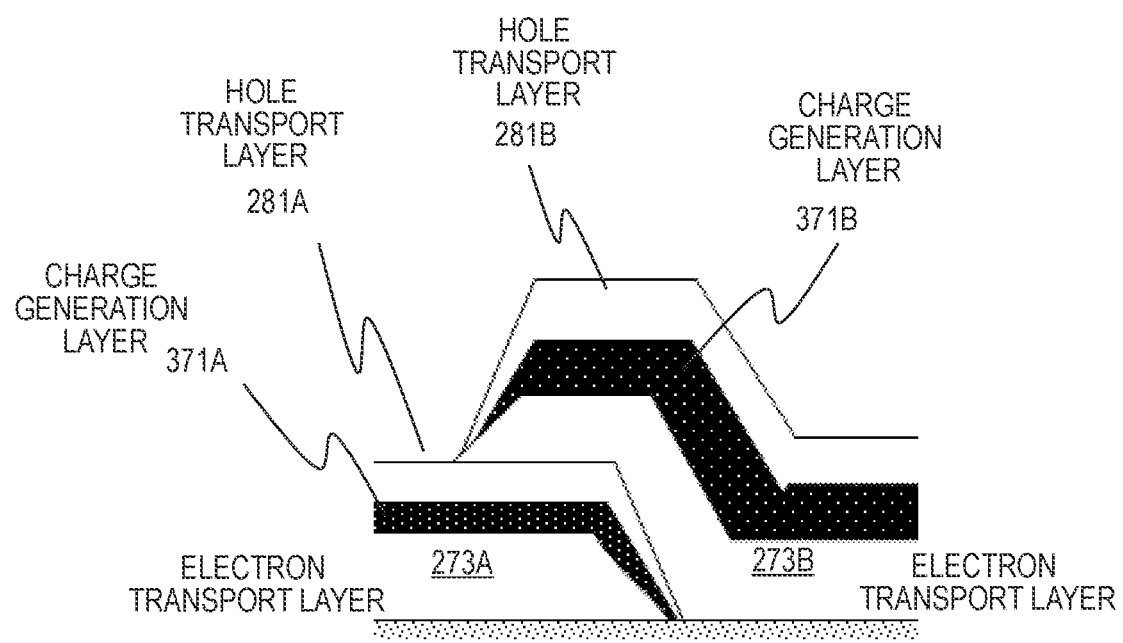
FIG. 8B is an enlarged diagram of the part encircled by a dashed line VIIIB in FIG. 8A.

FIG. 8A is a cross-sectional diagram illustrating still another configuration example of stack-structured light-emitting elements 210A and 210B adjacent to each other. FIG. 8B is an enlarged diagram of the part encircled by a dashed line VIIIB in FIG. 8A.

The configuration example illustrated in FIG. 8A includes charge generation layers 371A and 371B in place of the charge generation layers 291A and 291B in FIG. 3A. The charge generation layer 371A and the charge generation layer 371B overlap at their ends above the top face 256 of the pixel defining layer 253. This configuration enables the OLED display device to have higher resolution.

Each of the charge generation layers 371A and 371B has a single layer structure and consists of a single component layer. Specifically, the charge generation layers 371A and 371B supply and transport charges of both polarities, electrons and holes. The charge generation layers 371A and 371B can be made of ITO or $V_2O_5$, for example.

As illustrated in FIG. 8B, an end region of the charge generation layer 371B is laid above an end region of the charge generation layer 371A. The end region of the charge generation layer 371A is laid above an end region of the electron transport layer 273A of the lower light-emitting unit of the stack-structured light-emitting element 210A. The end regions of the charge generation layers 371A and 371B are tapered above the top face 256 of the pixel defining layer 253. The tapered charge generation layers can break the leak path.

An end region of the hole transport layer 281A of the upper light-emitting unit of the stack-structured light-emitting element 210A and an end region of the electron transport layer 273B of the lower light-emitting unit of the stack-structured light-emitting element 210B are interposed between the end region of the charge generation layer 371A and the end region of the charge generation layer 371B. The end region of the charge generation layer 371B is laid above the end region of the charge generation layer 371A with the end region of the hole transport layer 281A and the end region of the electron transport layer 273B interposed therebetween.

The end region of the hole transport layer 281A is in contact with the end regions of the charge generation layer 371A and the electron transport layer 273B and has interfaces with them. The end region of the electron transport layer 273B is in contact with the end regions of the hole transport layer 281A and the charge generation layer 371B and has interfaces with them.

The layered structure of the end regions of the charge generation layers includes the charge generation layer 371A, the hole transport layer 281A, the electron transport layer 273B, and the charge generation layer 371B laid in this order from the bottom.

The hole transport layer 281A and the electron transport layer 273B are located between the charge generation layers 371A and 371B. The charge generation layer 371A is not in direct contact with the electron transport layer 273B and these layers are separated by the hole transport layer 281A. The hole transport layer 281A is not in direct contact with the charge generation layer 371B and these layers are separated by the electron transport layer 273B. That is to say, the charge generation layers 371A and 371B are not in direct contact with each other and these layers are separated by the hole transport layer 281A and the electron transport layer 273B laid one above the other.

The hole transport layer 281A transmits holes and blocks electrons without transmitting them. The electron transport layer 273B transmits electrons and blocks holes without transmitting them. Accordingly, the hole transport layer 281A and the electron transport layer 273B laid one above the other block flows of holes and electrons between the charge generation layers 371A and 371B.

As described with reference to FIGS. 8A and 8B, an end region of the electron transport layer 273B that blocks holes is located between the charge generation layers 371A and 371B that generate holes and an end region of the hole transport layer 281A that blocks electrons is located between the charge generation layers 371A and 371B that generate electrons. The charge generation layers 371A and 371B generate electrons and holes as described with reference to FIGS. 8A and 8B. In addition to the end region of the electron transport layer 273B that blocks holes, the end region of the hole transport layer 281A that blocks electrons is located between the charge generation layers 371A and 371B.

As described above, the configuration example illustrated in FIGS. 8A and 8B effectively reduces the charge leakage at the part where ends of charge generation layers adjacent to each other are layered. The layered structure illustrated in FIGS. 8A and 8B can be produced by separately depositing the electron transport layer of the lower light-emitting unit to the hole transport layer of the upper light-emitting unit. For example, the manufacturing places a metal mask at two different positions using an alignment function to form the hole transport layers 281A and 281B and the electron transport layers 273A and 273B, as described in the formation of a charge generation layer. This layered structure is produced by forming the layers in the order of the electron transport layer 273A, the charge generation layer 371A, the hole transport layer 281A, the electron transport layer 273B, the charge generation layer 371B, and the hole transport layer 281B. Efficient manufacture of the OLED display device is achieved by using the same metal mask.

Figure 9A:
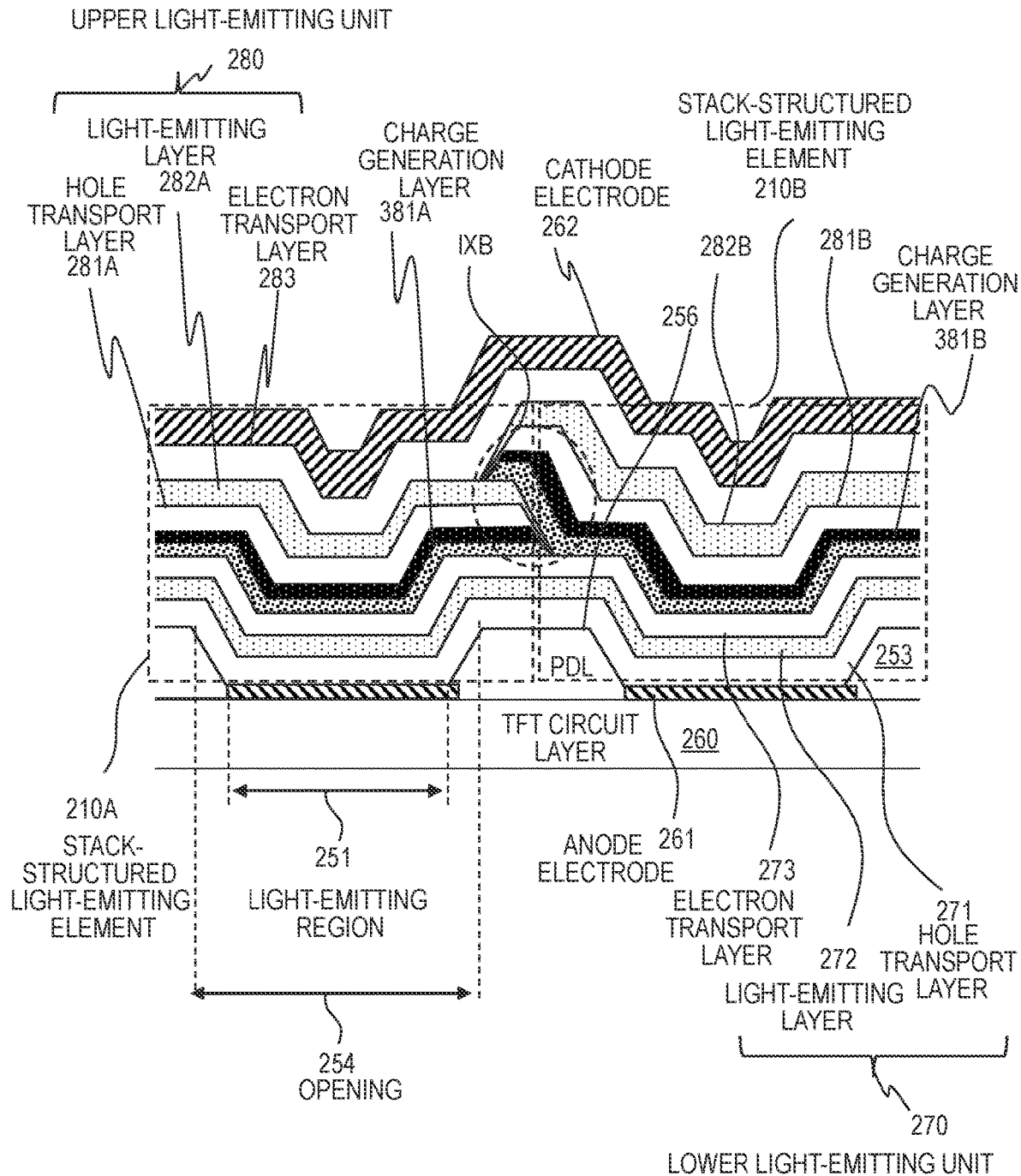
FIG. 9A is a cross-sectional diagram illustrating still another configuration example of stack-structured light-emitting elements adjacent to each other.
Figure 9B:
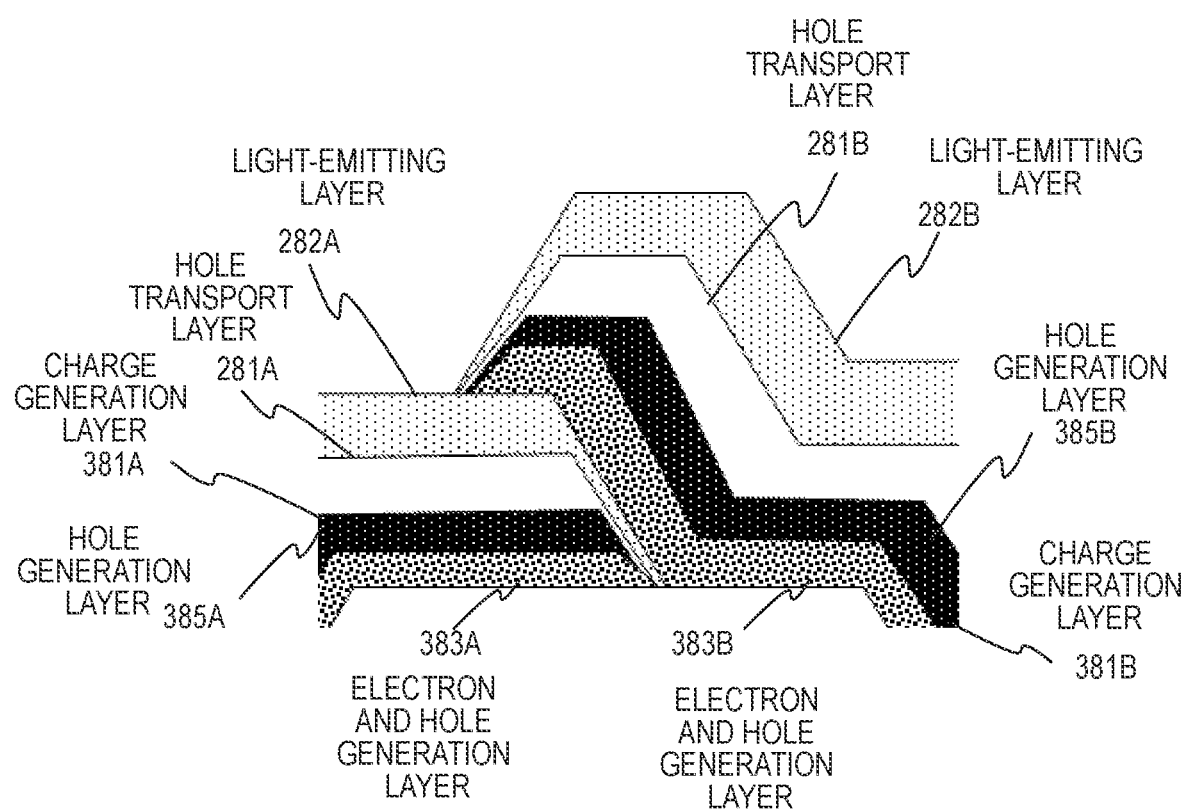
FIG. 9B is an enlarged diagram of the part encircled by a dashed line IXB in FIG. 9A.

FIG. 9A is a cross-sectional diagram illustrating still another configuration example of stack-structured light-emitting elements 210A and 210B adjacent to each other. FIG. 9B is an enlarged diagram of the part encircled by a dashed line IXB in FIG. 9A. The configuration example illustrated in FIG. 9A includes charge generation layers 381A and 381B in place of the charge generation layers 291A and 291B in FIG. 3A. The charge generation layer 381A and the charge generation layer 381B overlap at their ends above the top face 256 of the pixel defining layer 253. This configuration enables the OLED display device to have higher resolution.

The charge generation layer 381A consists of a lower electron and hole generation layer 383A and an upper hole generation layer 385A. In similar, the charge generation layer 381B consists of a lower electron and hole generation layer 383B and an upper hole generation layer 385B. The charge generation layers 381A and 381B can have a different structure, for example, the layered structure illustrated in FIG. 3B, 7B, or 8B.

As illustrated in FIG. 9B, an end region of the charge generation layer 381B is laid above an end region of the charge generation layer 381A. End regions of the hole transport layer 281A and the light-emitting layer 282A of the upper light-emitting unit of the stack-structured light-emitting element 210A are interposed between the end region of the charge generation layer 381A and the end region of the charge generation layer 381B. The end region of the charge generation layer 381B is laid above the end region of the charge generation layer 381A with the end regions of the hole transport layer 281A and the light-emitting layer 282A interposed therebetween.

The end regions of the charge generation layers 381A and 381B are tapered above the top face 256 of the pixel defining layer 253. The end regions of the electron and hole generation layer 383A and the hole generation layer 385A are tapered. The end regions of the electron and hole generation layer 383B and the hole generation layer 385B are also tapered. The tapered charge generation layers can break the leak path.

The end region of the hole transport layer 281A is in contact with the end region of the hole generation layer 385A of the charge generation layer 381A and the end region of the light-emitting layer 282A and has interfaces with them. The end region of the light-emitting layer 282A is in contact with the end region of the hole transport layer 281A and the end region of the electron and hole generation layer 383B of the charge generation layer 381B and has interfaces with them.

The layered structure of the end regions of the charge generation layers includes the electron and hole generation layer 383A, the hole generation layer 385A, the hole transport layer 281A, the light-emitting layer 282A, the electron and hole generation layer 383B, and the hole generation layer 385B laid in this order from the bottom.

The light-emitting layer 282A is located between the hole transport layer 281A and the electron and hole generation layer 383B of the charge generation layer 381B. The hole transport layer 281A is not in direct contact with the electron and hole generation layer 383B and these layers are separated by the light-emitting layer 282A. Focusing on the relation between the charge generation layers 381A and 381B, the charge generation layers 381A and 381B are not in direct contact with each other and these layers are separated by the light-emitting layer 282A interposed therebetween.

A light-emitting layer has a low mobility, compared to the other layers. For example, a hole transport layer has a hole mobility of approximately $10^{-4}$ cm$^2$/Vs but the hole mobility of the light-emitting layer is approximately $10^{-11}$ cm$^2$/Vs. For this reason, the light-emitting layer 282A effectively reduces the charge leakage in the layered structure of the end regions of charge generation layers adjacent to each other.

In the configuration example illustrated in FIGS. 9A and 9B, the light-emitting layer 282A is interposed between the charge generation layers 381A and 381B in the overlap region of the charge generation layers adjacent to each other, as described above. This configuration effectively reduces the charge leakage between the charge generation layers 381A and 381B. In the configuration example of FIG. 9B, the end region of the light-emitting layer 282A is not in direct contact with the end region of the charge generation layer 381A and these layers are separated by the end region of the hole transport layer 281A. In another configuration example, a part of the end region of the light-emitting layer 282A can be in contact with the end region of the charge generation layer 381A.

As illustrated in FIG. 9B, the end region of the hole transport layer 281B and the end region of the light-emitting layer 282B of the upper light-emitting unit of the stack-structured light-emitting element 210B are laid above the end region of the charge generation layer 381B. The layered structure in FIGS. 9A and 9B can be produced by separately depositing the charge generation layer to the light-emitting layer of the upper light-emitting unit. For example, the manufacturing places a metal mask at two different positions using an alignment function to form the hole transport layers 281A and 281B and the light-emitting layers 282A and 282B, as described in the formation of charge generation layers. This layered structure is produced by forming the layers in the order of the charge generation layer 381A, the hole transport layer 281A, the light-emitting layer 282A, the charge generation layer 381B, the hole transport layer 281B, and the light-emitting layer 282B. Efficient manufacture of the OLED display device is achieved by using the same metal mask.

Figure 10:
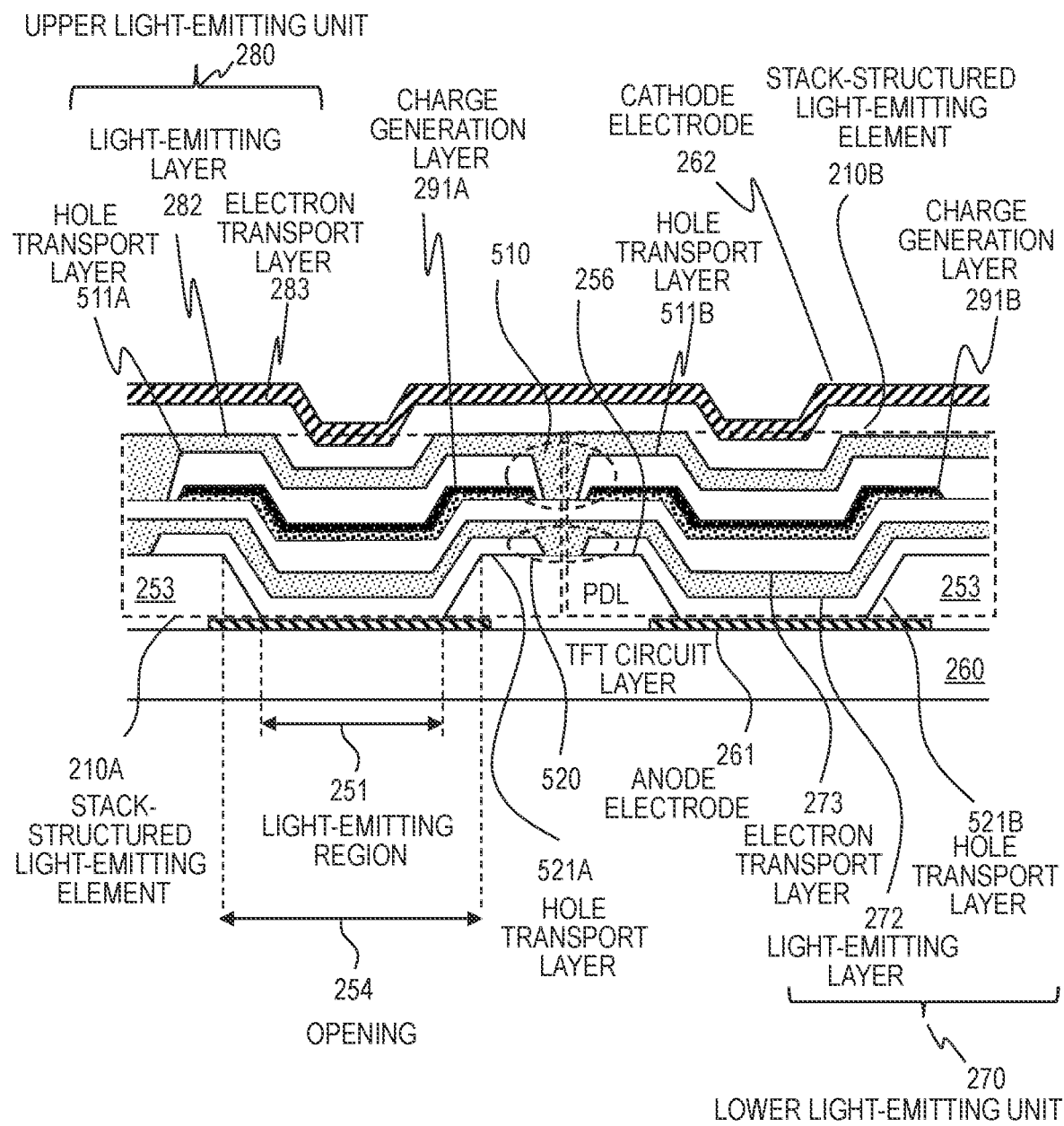
FIG. 10 is a cross-sectional diagram illustrating still another configuration example of stack-structured light-emitting elements adjacent to each other.

Another example of a stack-structured light-emitting element is described. FIG. 10 is a cross-sectional diagram illustrating still another configuration example of stack-structured light-emitting elements 210A and 210B adjacent to each other. The following mainly describes differences from the configuration example in FIG. 2B. In the configuration example of FIG. 10, the ends of the hole transport layer of the lower light-emitting unit and the ends of the hole transport layer of the upper light-emitting unit are located above the top face of the pixel defining layer.

The part encircled by a dashed line 510 in FIG. 10 corresponds to a part including end regions of the charge generation layer 291A and the hole transport layer 511A of the stack-structured light-emitting element 210A and the charge generation layer 291B and the hole transport layer 511B of the stack-structured light-emitting element 210B.

The charge generation layers 291A and 291B are provided above only a part of the top face of the pixel defining layer 253 and the ends of the charge generation layers 291A and 291B are located above the top face of the pixel defining layer 253. The ends of the charge generation layers 291A and 291B are distant from each other in an in-plane direction and there is a gap therebetween.

The hole transport layers 511A and 511B are provided above only a part of the top face of the pixel defining layer 253; the ends of the hole transport layers 511A and 511B are located above the top face of the pixel defining layer 253. The ends of the hole transport layers 511A and 511B are distant from each other in an in-plane direction and there is a gap therebetween. The end region of the hole transport layer 511A is tapered and covers the end region of the charge generation layer 291A. The end region of the hole transport layer 511B is tapered and covers the end region of the charge generation layer 291B. The hole transport layer 511A, the light-emitting layer 282, and the hole transport layer 511B are interposed between the ends of the charge generation layer 291A and the charge generation layer 291B in the in-plane direction.

The part encircled by a dashed line 520 in FIG. 10 corresponds to a part including end regions of the hole transport layer 521A of the stack-structured light-emitting element 210A and the hole transport layer 521B of the stack-structured light-emitting element 210B. The hole transport layers 521A and 521B are provided above only a part of the top face of the pixel defining layer 253: the ends of the hole transport layers 521A and 521B are located above the top face of the pixel defining layer 253. The ends of the hole transport layers 521A and 521B are distant from each other in an in-plane direction and there is a gap therebetween. The end regions of the hole transport layers 521A and 521B are tapered. The light-emitting layer 272 is interposed between the ends of the hole transport layer 521A and the hole transport layer 521B in the in-plane direction.

Figure 11A:
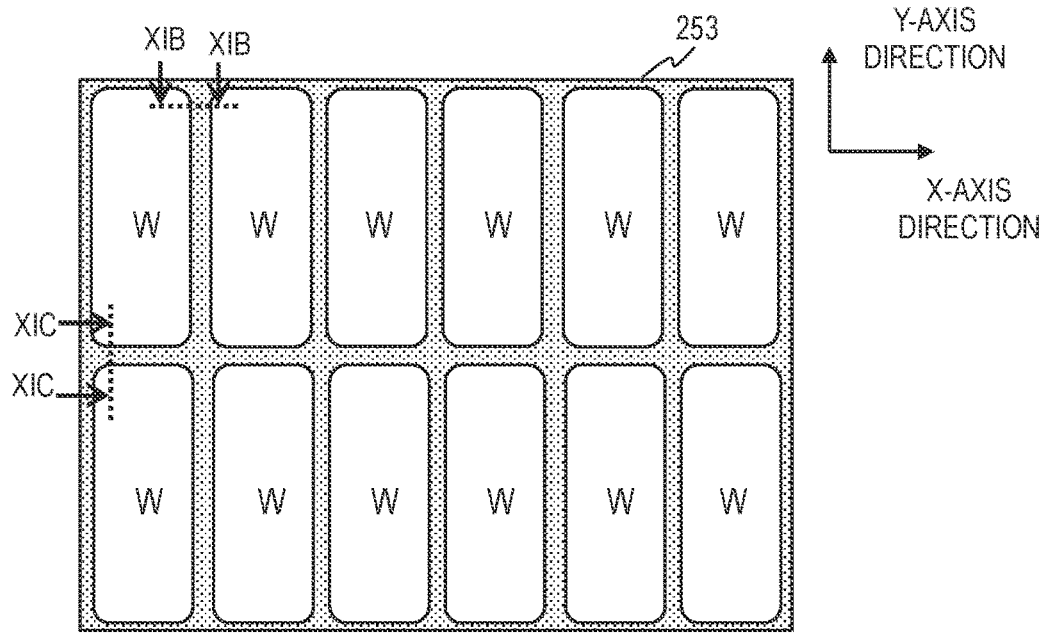
FIG. 11A is a plan diagram of a part of a stack-structured light-emitting element array.
Figure 11B:
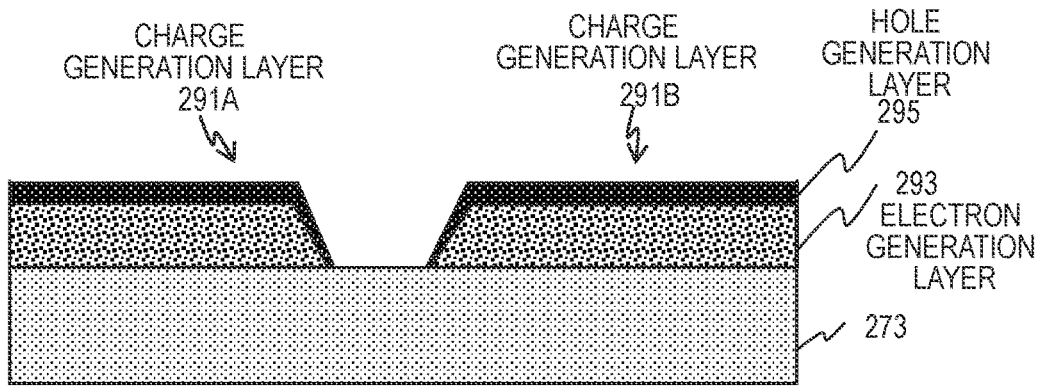
FIG. 11B schematically illustrates a part of the cross-sectional structure along the section line XIB-XIB in FIG. 11A.
Figure 11C:
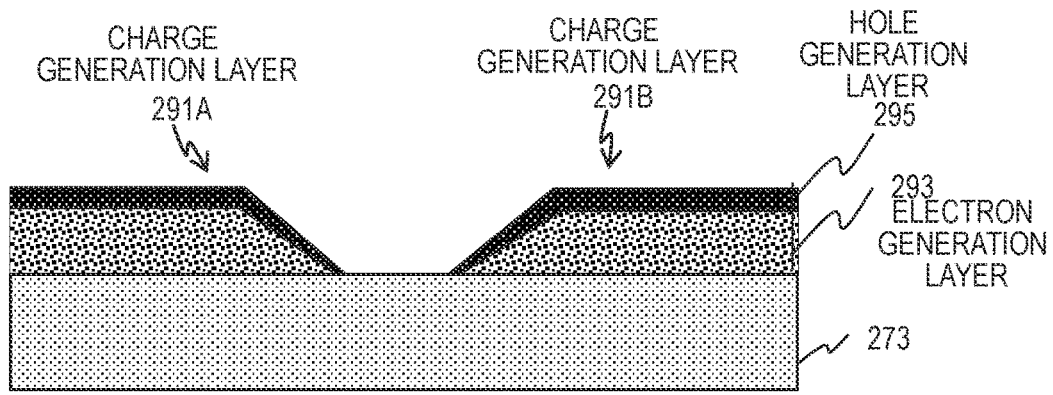
FIG. 11C schematically illustrates another part of the cross-sectional structure along the section line XIC-XIC in FIG. 11A.

Another example of the structure of a stack-structured light-emitting element is described. The following mainly describes differences from the configuration example described with reference to FIGS. 2A to 2C. FIG. 11A is a plan diagram of a part of a stack-structured light-emitting element array. FIG. 11B illustrates a part of the cross-sectional structure along the section line XIB-XIB in FIG. 11A. FIG. 11C illustrates another part of the cross-sectional structure along the section line XIC-XIC in FIG. 11A. The section line XIB-XIB is a section line extending along the X-axis and the section line XIC-XIC is a section line extending along the Y-axis.

FIG. 11B illustrates a border region between two stack-structured light-emitting elements adjacent along the X-axis. FIG. 11C illustrates a border between two stack-structured light-emitting elements adjacent along the Y-axis. As illustrated in FIGS. 11B and 11C, the charge generation layers 291A and 291B are provided to partially cover the top face 256 of the pixel defining layer 253 surrounding them. The charge generation layers 291A and 291B are provided above only a part of the top face 256 and their ends are located above the top face 256 of the pixel defining layer 253. The electron generation layer 293 is covered with the hole generation layer 295. The ends of the charge generation layers 291A and 291B are distant from each other in an in-plane direction and there is a gap therebetween.

The end region of the charge generation layer 291A and the end region of the charge generation layer 291B are tapered above the top face 256 of the pixel defining layer 253. The tapered charge generation layers can break the leak path because of their small thicknesses even if the films overlap because of misalignment in film formation. The tapers along the X-axis illustrated in FIG. 11B are sharper than the tapers along the Y-axis illustrated in FIG. 11C. More specifically, the angles (with respect to the planar face of the pixel defining layer 253) of the inclined faces at the ends (the third ends) of the hole generation layer 295 and the electron generation layer 293 in FIG. 11B are larger than the angles of the inclined faces at the ends (the fourth ends) of the hole generation layer 295 and the electron generation layer 293 in FIG. 11C.

The above-described structure having different taper angles can be produced by vapor deposition of the hole generation layer 295 and the electron generation layer 293 through a mask. The vapor deposition source ejects vaporized material from the opening of a nozzle to the external. An example of the vapor deposition source has nozzles aligned along the X-axis and moves along the Y-axis while ejecting the vaporized material.

Figure 12:
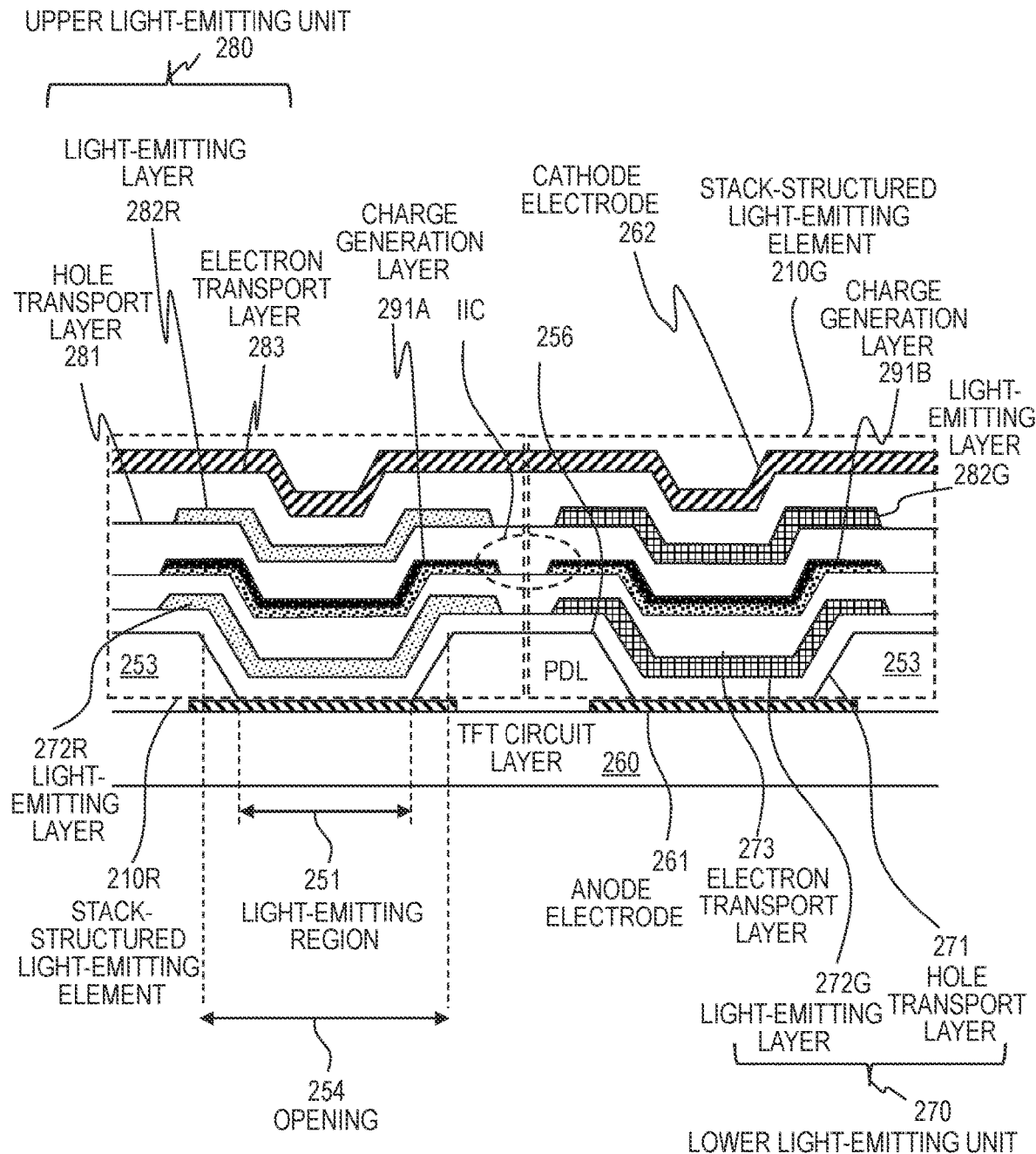
FIG. 12 is a cross-sectional diagram illustrating still another configuration example of stack-structured light-emitting elements adjacent to each other.

Still another example of a stack-structured light-emitting element is described. FIG. 12 is a cross-sectional diagram illustrating still another configuration example of stack-structured light-emitting elements adjacent to each other. The following mainly describes differences from the configuration example in FIG. 2B. The stack-structured light-emitting element 210R is to emit red light and the stack-structured light-emitting element 210G is to emit green light. In addition to stack-structured light-emitting elements for emitting these colors of light, the display region includes stack-structured light-emitting elements for emitting blue light.

Both of the lower light-emitting unit 270 and the upper light-emitting unit 280 of the stack-structured light-emitting element 210R emit red light. This means that the light-emitting layers 272R and 282R of the two light-emitting units of the stack-structured light-emitting element 210R emit red light. Both of the lower light-emitting unit 270 and the upper light-emitting unit 280 of the stack-structured light-emitting element 210G emit green light. This means that the light-emitting layers 272G and 282G of the two light-emitting units of the stack-structured light-emitting element 210G emit green light. Both of the light-emitting layers of the two light-emitting units of a stack-structured blue light emitting element emit blue light.

Figure 13:
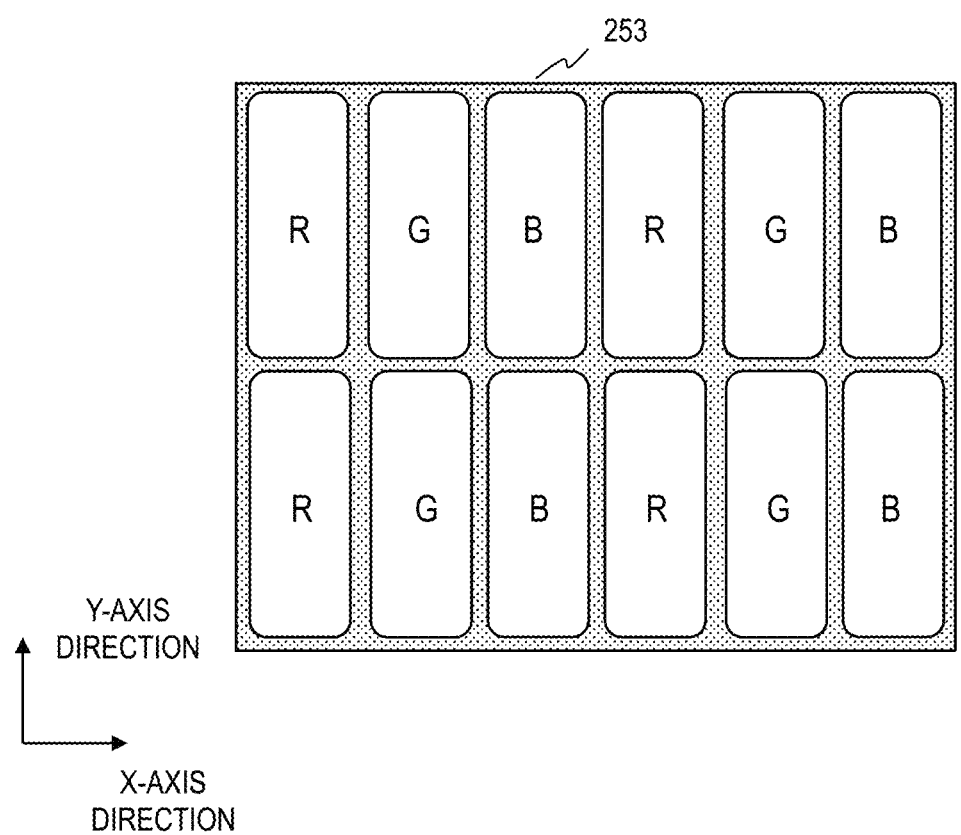
FIG. 13 is a plan diagram illustrating an example of the layout of stack-structured light-emitting elements for emitting red, green, and blue light in FIG. 12.

FIG. 13 is a plan diagram illustrating an example of the layout of stack-structured light-emitting elements for emitting red, green, and blue light illustrated in FIG. 12. FIG. 13 illustrates a part of a stack-structured light-emitting element array and illustrates an example of a stripe layout, in which stack-structured light-emitting elements for red, green, and blue light are cyclically disposed along the X-axis and stack-structured light-emitting elements for the same color of light are disposed along the Y-axis.

The description provided with reference to FIGS. 11B and 11C is applicable to this configuration example. As described above, the tapers along the X-axis are sharper than the tapers along the Y-axis. This configuration effectively reduces the charge leakage between stack-structured light-emitting elements for emitting different colors of light.

Figure 14:
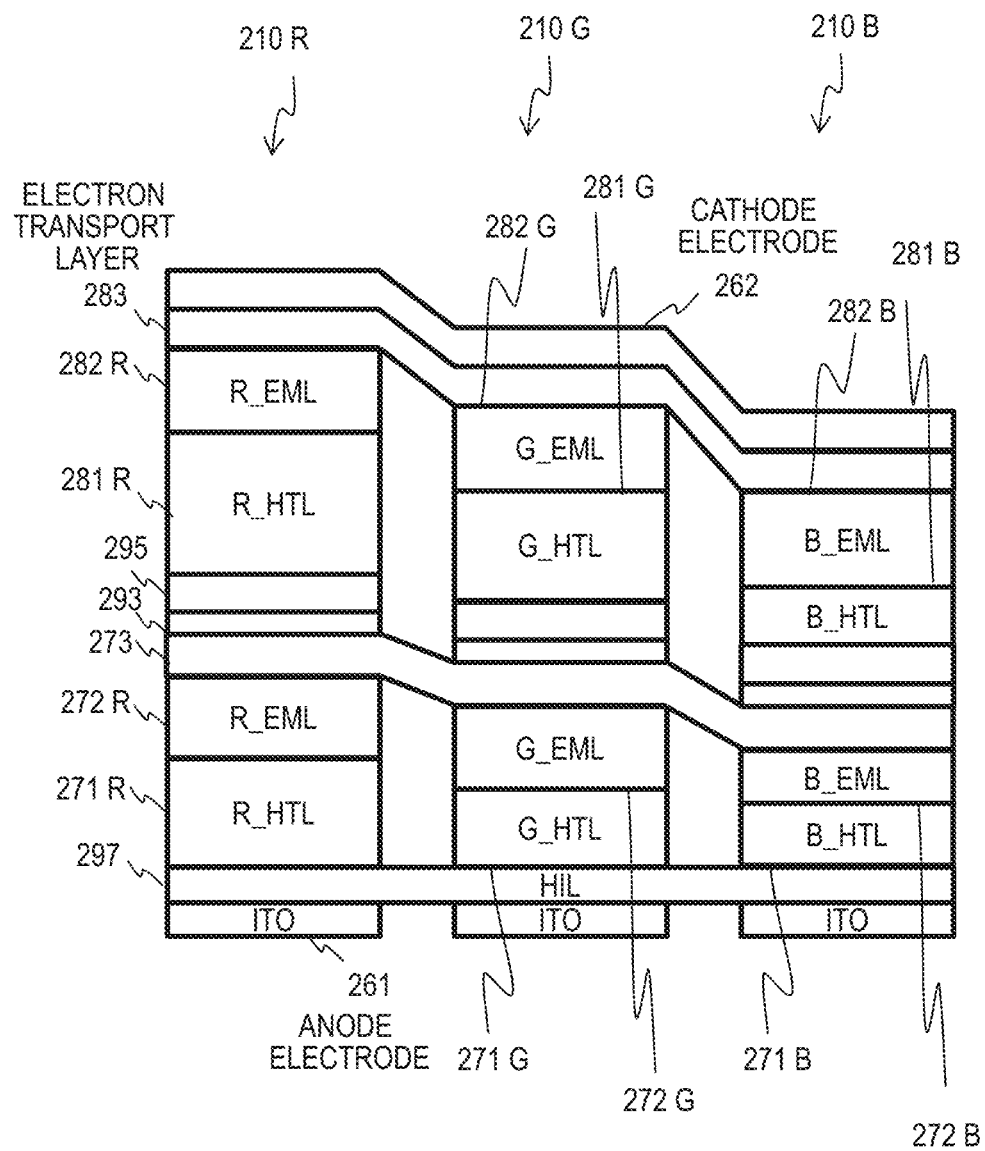
FIG. 14 illustrates still another configuration example of a stack-structured light-emitting element.

FIG. 14 schematically illustrates still another example of the structure of stack-structured light-emitting elements. FIG. 14 illustrates stack-structured light-emitting elements 210R, 210G, and 210B for emitting red, green, and blue light. Any of the structures between stack-structured light-emitting elements adjacent to each other in the foregoing embodiments is applied to the configuration example of FIG. 14. The stack-structured red light emitting element 210R includes red light emitting layers 272R and 282R and hole transport layers 271R and 281R specific for stack-structured red light emitting elements.

The stack-structured green light emitting element 210G includes green light emitting layers 272G and 282G and hole transport layers 271G and 281G specific for stack-structured green light emitting elements. The stack-structured blue light emitting element 210B includes blue light emitting layers 272B and 282B and hole transport layers 271B and 281B specific for stack-structured blue light emitting elements. A hole injection layer 297 is provided between the anode electrodes (ITO) 261 and the hole transport layers 271R, 271G, and 271B.

The stack-structured light-emitting elements 210R, 210G, and 210B for different colors of light include hole transport layers having different thicknesses. Specifically, the total thickness of the hole transport layers 271R and 281R of the stack-structured red light emitting element 210R is largest and the total thickness of the hole transport layers 271B and 281B of the stack-structured blue light emitting element 210B is smallest.

In the example of FIG. 14, the hole transport layer 271R is thicker than both the hole transport layers 271G and 271B and the hole transport layer 271G is thicker than the hole transport layer 271B. The hole transport layer 281R is thicker than both the hole transport layers 281G and 281B and the hole transport layer 281G is thicker than the hole transport layer 281B. Each light-emitting unit can include a hole injection layer not shown in FIG. 14.

In the example of FIG. 14, the lower light-emitting units of the stack-structured light-emitting elements for different colors of light have different total thicknesses and the upper light-emitting units of the stack-structured light-emitting elements for different colors of light have different total thicknesses. Specifically, the light-emitting units of the stack-structured red light emitting element are thickest and the light-emitting units of the stack-structured blue light emitting element are thinnest.

The stack-structured light-emitting elements attain higher light emission efficiency by including hole transport layers/hole injection layers (hole transport layers or hole injection layers) having different thicknesses depending on the color of the light-emitting layer of the stack-structured light-emitting element as described above. Because of the different thicknesses, the hole transport layers/hole injection layers are formed separately for individual light-emitting layers. The charge generation layer separated between stack-structured light-emitting elements reduces charge leakage between the stack-structured light-emitting elements.

The display regions described in the foregoing embodiments have a top emission pixel structure. The top emission pixel structure includes a cathode electrode on the light-emitting side (the upper side of the drawings). The cathode electrode has a shape that fully covers the whole display region. The features of this disclosure are applicable to an OLED display device having a bottom emission pixel structure. The bottom emission pixel structure includes a transparent anode electrode and a reflective cathode electrode and emits light to the external through the TFT substrate.

Examples of Application

Figure 15:
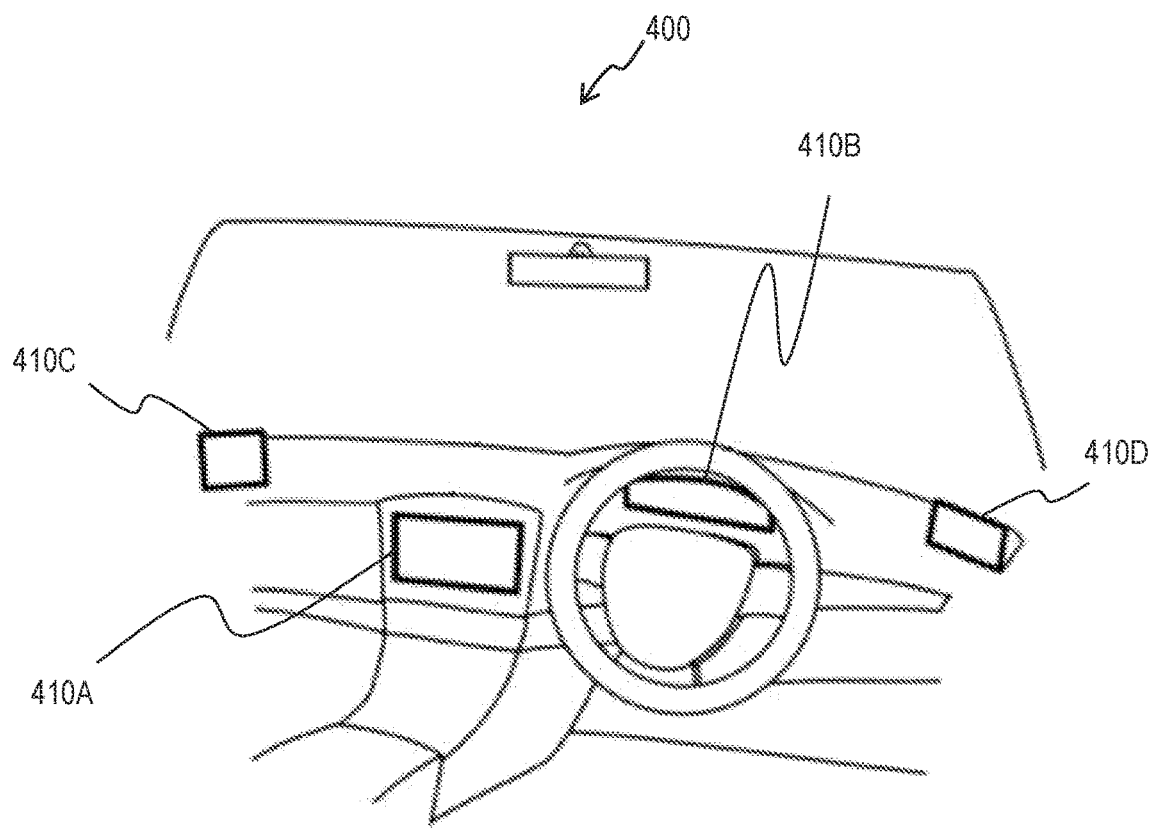
FIG. 15 schematically illustrates a configuration example of a vehicle and on-vehicle display devices.

Hereinafter, examples of application of an OLED light-emitting device according to an embodiment of this specification are described. FIG. 15 schematically illustrates examples of on-vehicle display devices employing display devices according to an embodiment. FIG. 15 illustrates a configuration example of an automobile 400 equipped with on-vehicle display devices in this embodiment and the on-vehicle display devices 410A to 410D.

An on-vehicle display device is mounted inside an automobile 400 as an example of a vehicle to display a variety of information. The on-vehicle display devices in FIG. 15 are a center information display (CID) 410A, a cluster display 410B, and side displays 410C and 410D. The CID 410A, the cluster display 410B, and the side displays 410C and 410D are display devices employing the display device 1.

The CID 410A is mounted at the center of the dashboard of the automobile 400 and displays information on an audio system, a navigation system, and a vehicle condition management system, for example. The cluster display 410B displays a speedometer, for example. The side displays 410C and 410D are mounted on the left and the right of the dashboard to function as side mirrors by displaying camera footage.

The inside of the automobile 400 where these on-vehicle display devices are mounted could suffer high temperature because of the effect of sunlight. The on-vehicle display devices can have a long high-temperature life by employing the OLED display device 1. Accordingly, the on-vehicle display devices exposed to high-temperature environment can provide high-quality display for a long time.

Although the CID 410A, the cluster display 410B, and the side displays 410C and 410D are provided as examples of on-vehicle display devices, on-vehicle display devices are not limited to these. The on-vehicle display device can be any kind of display device designed to be installed in a vehicle. The display device according to an embodiment of this specification can be used in an industrial transport machinery to be exposed to high-temperature environment.

Figure 16:
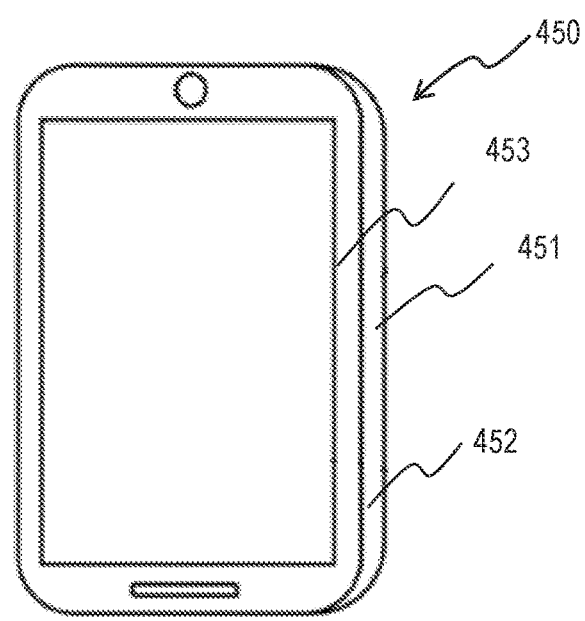
FIG. 16 schematically illustrates a configuration example of a smartphone.

FIG. 16 is another example of application of a display device according to an embodiment of this specification. FIG. 16 schematically illustrates an example of an electronic device including the display device 1 according to an embodiment. FIG. 16 is a perspective diagram of a smartphone 450 as the electronic device. This smartphone 450 includes a display device 453 according to an embodiment in a housing 451; the display device 453 is covered with a cover glass 452 on the side to display images. In addition to these components, devices for providing the functions required for a smartphone, such as a transmitter, a receiver, various controllers, a storage device, audio devices including a speaker and a microphone, and a battery, are included in the housing 451.

The smartphone 450 can be sometimes used in high-temperature environment such as outdoor. The smartphone 450 can have a long high-temperature life by employing the display device 453 according to an embodiment of this specification. Accordingly, the smartphone 450 exposed to high-temperature environment can provide high-quality display for a long time.

Although a smartphone is provided as an example of an electronic device, electronic devices to which the display device according to an embodiment is applicable are not limited to this. For example, a personal computer, a personal digital assistance (PDA), a tablet terminal, a head-mount display, a projector, and a digital (video) camera can include the display device according to an embodiment.

Figure 17:
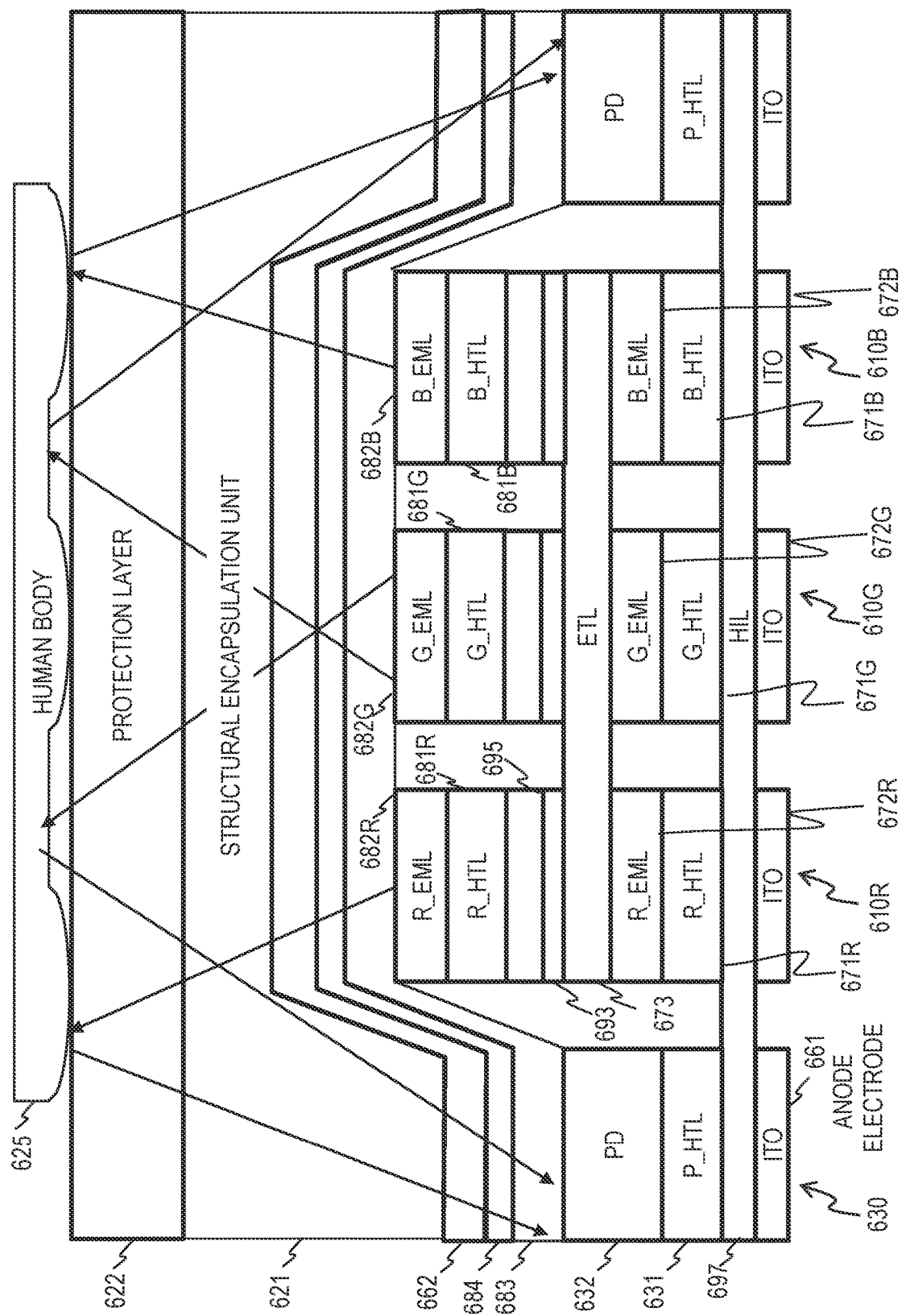
FIG. 17 illustrates an example of a biometric sensor to which the OLED light-emitting device in an embodiment of this specification is applied.

FIG. 17 illustrates an example of a biometric sensor to which an OLED light-emitting device according to an embodiment of this specification is applied. The biometric sensor includes OLED elements according to an embodiment of this specification and photodetectors. The biometric sensor includes stack-structured light-emitting elements 610R, 610G, and 610B for red light, green light, and blue light. The biometric sensor further includes photodetectors 630. FIG. 17 provides one each of the stack-structured light-emitting elements 610R, 610G, and 610B for red light, green light, and blue light and two photodetectors 630 by way of example. The stack-structured light-emitting elements 610R, 610G, and 610B have the same structures as the corresponding ones in the OLED display device in a foregoing embodiment.

The stack-structured red light emitting element 610R includes red light emitting layers 672R and 682R and hole transport layers 671R and 681R specific for the stack-structured red light emitting elements. The stack-structured green light emitting element 610G includes green light emitting layers 672G and 682G and hole transport layers 671G and 681G specific for the stack-structured green light emitting elements. The stack-structured blue light-emitting element 610B includes blue light emitting layers 672B and 682B and hole transport layers 671B and 681B specific for the stack-structured blue light emitting elements. A photodetector 630 includes a photodetection layer 632 and a hole transport layer 631 specific for the photodetector.

Each of the stack-structured light-emitting elements 610R, 610G, and 610B and the photodetectors 630 includes an anode electrode 661 and a cathode electrode 662. A hole injection layer 697 is provided between the anode electrodes 661 and the hole transport layers 631, 671R, 671G, and 671B.

An electron transport layer 673, an electron generation layer 693, and a hole generation layer 695 are provided between the light-emitting layers 672R, 672G, and 672B and the hole transport layers 681R, 681G, and 681B. Another electron transport layer 683 and an electron injection layer 684 are provided between the cathode electrode 662 and the light-emitting layers 682R, 682G, and 682B and the photodetection layers 632.

A structural encapsulation unit 621 covers all stack-structured light-emitting elements 610R, 610G, and 610B and the photodetectors 630. A protection layer 622 is laid on the structural encapsulation unit 621 to cover the structural encapsulation unit 621.

The biometric sensor lights the stack-structured light-emitting elements 610R, 610G, and 610B in turn. The light emitted from the stack-structured light-emitting elements 610R, 610G, and 610B is reflected by a human body 625 and enters the photodetectors 630, allowing the biometric sensor to detect a variety of biometric information. For example, a conventional biometric sensor for measuring a blood oxygen level includes red LEDs and near-infrared LEDs. In contrast, a biometric sensor employing OLED elements as light sources can include stack-structured red light emitting elements and stack-structured green light emitting elements instead of near-infrared LEDs. Although FIG. 17 provides an example of a sensor including stack-structured light-emitting elements for red, green, and blue light and photodetectors, the color of light to be emitted from the stack-structured light-emitting elements can be selected as appropriate depending on what to measure.

A compact sensor can be attained by disposing light-emitting elements as light sources closer to one another. OLED elements are appropriate because they can be produced small, lightweight, and thin. Meanwhile, there are needs to biometrically monitor a wide area of a body surface. OLED elements are easy to be fabricated on a planar substrate to emit uniform light.

Moreover, OLED elements can be fabricated even on a flexible substrate and therefore, a sensor employing OLED elements can conform to a wide area of the body surface. To attain higher sensitivity, the intensity of light from the light source has to be increased. To meet such needs to the sensor, the configuration of stack-structured OLED elements having a charge generation layer separated between stack-structured OLED elements can be expected to be applied to the light sources for the sensor.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. An OLED light-emitting device comprising:
an element separation layer having openings defining light-emitting regions and a top face between the openings;
lower electrodes exposed inside the openings;
a first stack-structured light-emitting element disposed on a first lower electrode of the lower electrodes; and
a second stack-structured light-emitting element disposed on a second lower electrode of the lower electrodes adjacent to the first lower electrode, the second stack-structured light-emitting element being adjacent to the first stack-structured light-emitting element;
wherein the first stack-structured light-emitting element includes a first light-emitting unit and a second light-emitting unit stacked above the element separation layer and a first charge generation layer located between the first light-emitting unit and the second light-emitting unit,
wherein each of the first light-emitting unit and the second light-emitting unit includes a light-emitting layer,
wherein the first charge generation layer includes a first charge generation component layer configured to generate a first charge being a positive charge or a negative charge and a second charge generation component layer located above the first charge generation component layer and configured to generate a second charge having a polarity opposite of the first charge,
wherein the second stack-structured light-emitting element includes a third light-emitting unit and a fourth light-emitting unit stacked above the element separation layer and a second charge generation layer located between the third light-emitting unit and the fourth light-emitting unit,
wherein each of the third light-emitting unit and the fourth light-emitting unit includes a light-emitting layer,
wherein the second charge generation layer includes a third charge generation component layer configured to generate a third charge having a polarity same as the first charge and a fourth charge generation component layer located above the third charge generation component layer and configured to generate a fourth charge having a polarity opposite of the third charge,
wherein a first end region of the first charge generation layer and a second end region of the second charge generation layer overlap above the top face of the element separation layer,
wherein the overlap region includes the first charge generation component layer, the second charge generation component layer, the third charge generation component layer, and the fourth charge generation component layer laid in this order from the bottom,
wherein the second charge generation component layer between the first charge generation component layer and the third charge generation component layer is configured to block the first charge and the third charge, and wherein the third charge generation component layer between the second charge generation component layer and the fourth charge generation component layer is configured to block the second charge and the fourth charge.

2. The OLED light-emitting device according to claim 1, wherein, in the overlap region, an end region of the light-emitting layer of the first stack-structured light-emitting element is interposed between the first charge generation layer and the second charge generation layer.

3. The OLED light-emitting device according to claim 1, wherein the first end region of the first charge generation layer and the second end region of the second charge generation layer are tapered above the top face of the element separation layer.

4. The OLED light-emitting device according to claim 1,
wherein the first light-emitting unit and the second light-emitting unit are configured to emit light of a first color,
wherein the third light-emitting unit and the fourth light-emitting unit are configured to emit light of a second color,
wherein each of the first light-emitting unit and the second light-emitting unit includes a hole transport layer,
wherein each of the third light-emitting unit and the fourth light-emitting unit includes a hole transport layer, and
wherein the hole transport layers of the first light-emitting unit and the second light-emitting unit are thicker than the hole transport layers of the third light-emitting unit and the fourth light-emitting unit.

5. A display device including the OLED light-emitting device according to claim 1.

6. An electronic device including the OLED light-emitting device according to claim 1.

7. A method of manufacturing an OLED light-emitting device, the method comprising:
forming lower electrodes;
forming an element separation layer having openings to define light-emitting regions and a top face between openings in such a shape that each lower electrode is exposed from an opening; and
forming a first stack-structured light-emitting element and a second stack-structured light-emitting element adjacent to each other above the element separation layer,
wherein the first stack-structured light-emitting element includes a first light-emitting unit and a second light-emitting unit stacked above the element separation layer and a first charge generation layer located between the first light-emitting unit and the second light-emitting unit,
wherein each of the first light-emitting unit and the second light-emitting unit includes a light-emitting layer, wherein the first charge generation layer includes a first charge generation component layer configured to generate a first charge being a positive charge or a negative charge and a second charge generation component layer located above the first charge generation component layer and configured to generate a second charge having a polarity opposite of the first charge,
wherein the second stack-structured light-emitting element includes a third light-emitting unit and a fourth light-emitting unit stacked above the element separation layer and a second charge generation layer located between the third light-emitting unit and the fourth light-emitting unit,
wherein each of the third light-emitting unit and the fourth light-emitting unit includes a light-emitting layer,
wherein the second charge generation layer includes a third charge generation component layer configured to generate a third charge having a polarity same as the first charge and a fourth charge generation component layer located above the third charge generation component layer and configured to generate a fourth charge having a polarity opposite of the third charge,
wherein a first end region of the first charge generation layer and a second end region of the second charge generation layer overlap above the top face of the element separation layer,
wherein the overlap region includes the first charge generation component layer, the second charge generation component layer, the third charge generation component layer, and the fourth charge generation component layer laid in this order from the bottom,
wherein the second charge generation component layer between the first charge generation component layer and the third charge generation component layer is configured to block the first charge and the third charge, and
wherein the third charge generation component layer between the second charge generation component layer and the fourth charge generation component layer is configured to block the second charge and the fourth charge.

8. The method according to claim 7, further comprising:
forming the first charge generation component layer of the first charge generation layer by vapor deposition with a metal mask placed at a first position;
placing the metal mask at a second position by moving the metal mask from the first position after forming the first charge generation component layer; and
forming the third charge generation component layer of the second charge generation layer by vapor deposition of same material as the first charge generation component layer with the metal mask placed at the second position.

* * * * *